(12) United States Patent
Wu

(10) Patent No.: US 11,277,130 B2
(45) Date of Patent: *Mar. 15, 2022

(54) HIGH SPEED AND HIGH VOLTAGE DRIVER

(71) Applicant: pSemi Corporation, San Diego, CA (US)

(72) Inventor: Gary Chunshien Wu, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/021,888

(22) Filed: Sep. 15, 2020

(65) Prior Publication Data

US 2021/0067158 A1     Mar. 4, 2021

Related U.S. Application Data

(63) Continuation of application No. 16/201,921, filed on Nov. 27, 2018, now Pat. No. 10,784,861, which is a
(Continued)

(51) Int. Cl.
*H03K 17/687*     (2006.01)
*H02M 1/088*     (2006.01)
(Continued)

(52) U.S. Cl.
CPC ........ *H03K 17/6872* (2013.01); *H02M 1/088* (2013.01); *H03K 17/04106* (2013.01);
(Continued)

(58) Field of Classification Search
CPC ................. H03K 17/04; H03K 17/041; H03K 17/04106; H03K 17/06; H03K 17/063;
(Continued)

(56) References Cited

U.S. PATENT DOCUMENTS 5,936,433 A    8/1999   Holloway
5,973,534 A    10/1999   Singh
(Continued)

FOREIGN PATENT DOCUMENTS

JP    2001094404     4/2001
KR    20010003736     1/2001
(Continued)

OTHER PUBLICATIONS

Cole, Brandon S., Office Action received from the USPTO dated May 30, 2018 for U.S. Appl. No. 15/918,933, 9 pgs.
(Continued)

*Primary Examiner* — Long Nguyen
(74) *Attorney, Agent, or Firm* — Jaquez Land Greenhaus & McFarland LLP; Alessandro Steinfl, Esq.

(57) ABSTRACT

Systems, methods, and apparatus for biasing a high speed and high voltage driver using only low voltage transistors are described. The apparatus and method are adapted to control biasing voltages to the low voltage transistors such as not to exceed operating voltages of the low voltage transistors while allowing for DC to high speed operation of the driver at high voltage. A stackable and modular architecture of the driver and biasing stages is provided which can grow with a higher voltage requirement of the driver. Capacitive voltage division is used for high speed bias voltage regulation during transient phases of the driver, and resistive voltage division is used to provide bias voltage at steady state. A simpler open-drain configuration is also presented which can be used in pull-up or pull-down modes.

20 Claims, 21 Drawing Sheets

Related U.S. Application Data continuation of application No. 15/918,933, filed on Mar. 12, 2018, now Pat. No. 10,171,075, which is a continuation of application No. 15/701,304, filed on Sep. 11, 2017, now Pat. No. 9,979,387, which is a continuation of application No. 15/066,647, filed on Mar. 10, 2016, now Pat. No. 9,793,892.

(51) Int. Cl.
*H03K 17/10* (2006.01)
*H03K 19/01* (2006.01)
*H03K 17/041* (2006.01)
*H03K 19/0175* (2006.01)

(52) U.S. Cl.
CPC .......... *H03K 17/102* (2013.01); *H03K 19/01* (2013.01); *H03K 19/017509* (2013.01); *H03K 2217/0081* (2013.01)

(58) Field of Classification Search
CPC ...... H03K 17/10; H03K 17/102; H03K 17/12; H03K 17/122; H03K 17/16; H03K 17/161; H03K 19/0013; H03K 19/00361; H03K 19/00315; H03K 19/01; H03K 19/017; H03K 19/017509; H03K 19/0185; H03K 2217/0081; H02M 1/088
See application file for complete search history.

(56) References Cited

U.S. PATENT DOCUMENTS

| | | | |
|---|---|---|---|
| 6,262,601 | B1 | 7/2001 | Choe et al. |
| 7,936,209 | B2 | 5/2011 | Bhattacharya et al. |
| 9,143,124 | B2 | 9/2015 | Cam |
| 9,252,651 | B2 | 2/2016 | Mott et al. |
| 9,509,263 | B2 | 11/2016 | Lam |
| 9,793,892 | B2 * | 10/2017 | Wu ........................ H03K 19/01 |
| 9,979,387 | B2 * | 5/2018 | Wu ...................... H03K 17/102 |
| 10,171,075 | B2 * | 1/2019 | Wu ...................... H03K 17/102 |
| 10,680,605 | B2 * | 6/2020 | Schleicher ........... H03K 17/693 |
| 10,784,861 | B2 * | 9/2020 | Wu .................. H03K 17/04106 |
| 2005/0040854 | A1 | 2/2005 | Mentze et al. |
| 2007/0008002 | A1 | 1/2007 | Lawson et al. |
| 2008/0191745 | A1 | 8/2008 | Lawson et al. |
| 2010/0156494 | A1 | 6/2010 | Turner et al. |
| 2010/0188144 | A1 | 7/2010 | Iriguchi |
| 2010/0271118 | A1 | 10/2010 | Bhattacharya et al. |
| 2012/0049956 | A1 | 3/2012 | Lam |
| 2012/0200338 | A1 | 8/2012 | Olson |
| 2014/0125402 | A1 | 5/2014 | Chen |
| 2014/0306674 | A1 | 10/2014 | Kondou |
| 2015/0123640 | A1 | 5/2015 | Kondou |
| 2016/0248329 | A1 | 8/2016 | Phillips |
| 2016/0285454 | A1 | 9/2016 | Gupta |
| 2016/0329891 | A1 | 11/2016 | Bakalski et al. |
| 2017/0201244 | A1 | 7/2017 | Kerr |
| 2017/0201248 | A1 | 7/2017 | Scott |
| 2017/0264288 | A1 | 9/2017 | Wu |
| 2017/0272066 | A1 | 9/2017 | Scott |
| 2018/0076812 | A1 | 3/2018 | Wu |
| 2018/0241393 | A1 | 8/2018 | Wu |
| 2019/0363710 | A1 | 11/2019 | Wu |

FOREIGN PATENT DOCUMENTS

| | | |
|---|---|---|
| WO | 2013034509 | 3/2013 |
| WO | 2017155557 | 9/2017 |

OTHER PUBLICATIONS

Cole, Brandon S., Notice of Allowance received from the USPTO dated Oct. 19, 2018 for U.S. Appl. No. 15/918,933, 10 pgs.
PSemi Corporation, Preliminary Amendment filed in the USPTO dated May 10, 2018 for U.S. Appl. No. 15/918,933, 8 pgs.
PSemi Corporation, Response filed in the USPTO dated Aug. 29, 2018 for U.S. Appl. No. 15/918,933, 3 pgs.
Nguyen, Long T., Office Action received from the USPTO dated Sep. 30, 2019 for U.S. Appl. No. 16/201,912, 12 pgs.
Nguyen, Long T., Notice of Allowance received from the USPTO dated Jan. 30, 2020 for U.S. Appl. No. 16/201,912, 7 pgs.
PSemi Corporation, Preliminary Amendment filed in the USPTO dated Aug. 19, 2019 for U.S. Appl. No. 16/201,912, 8 pgs.
PSemi Corporation, Response filed in the USPTO dated Dec. 30, 2019 for U.S. Appl. No. 16/201,912, 10 pgs.
PSemi Corporation, Submission with RCE filed in the USPTO dated Apr. 28, 2020 for U.S. Appl. No. 16/201,912, 10 pgs.
Santos, Paulo, Written Opinion received from the EPO dated Feb. 6, 2018 for appln. No. PCT/US2016/029622, 7 pgs.
Cole, Brandon S., Office Action received from the USPTO dated Mar. 8, 2017 for U.S. Appl. No. 15/066,647, 6 pgs.
Cole, Brandon S., Office Action received from the USPTO dated May 1, 2017 for U.S. Appl. No. 15/066,647, 29 pgs.
Cole, Brandon S., Notice of Allowance received from the USPTO dated Aug. 1, 2017 for U.S. Appl. No. 15/066,647, 12 pgs.
Wu, Gary, Response filed in the USPTO dated Mar. 27, 2017 for U.S. Appl. No. 15/066,647, 20 pgs.
Wu, Gary, Response filed in the USPTO dated Jun. 26, 2017 for U.S. Appl. No. 15/066,647, 30 pgs.
Ghilini, Marie, Invitation to Pay Additional Fees and, Where Applicable, Protest Fee received from the EPO dated Nov. 16, 2016 for appln. No. PCT/US2016/029622, 7 pgs.
Santos, Paulo, International Search Report and Written Opinion received from the EPO dated Jan. 17, 2017 for appln. No. PCT/US2016/029622, 19 pgs.
Peregrine Semiconductor Corporation, Demand and Amendment filed in the EPO dated Dec. 15, 2017 for appln. No. PCT/US2016/029622, 37 pgs.
Cole, Brandon S., Notice of Allowance received from the USPTO dated Feb. 1, 2018 for U.S. Appl. No. 15/701,304, 15 pgs.
Wu, Gary, Preliminary Amendment filed in the USPTO dated Dec. 4, 2017 for U.S. Appl. No. 15/701,304, 7 pgs.
Yang, et al., English translation of Office Action received from the CNIPA dated Aug. 10, 2021 for appln. No. 201680083259.4, 7 pgs.

* cited by examiner

HIGH SPEED AND HIGH VOLTAGE DRIVER

CROSS-REFERENCE TO RELATED APPLICATION—CLAIMS OF PRIORITY

This application is a continuation of, and claims the benefit of priority under 35 USC § 120 of, commonly assigned and prior U.S. application Ser. No. 16/201,921, "High Speed and High Voltage Driver", filed Nov. 27, 2018, now U.S. Pat. No. 10,784,861, issued Sep. 22, 2020; which is a continuation of, and claims the benefit of priority under 35 USC § 120 of, commonly assigned prior U.S. application Ser. No. 15/918,933, "High Speed and High Voltage Driver", filed Mar. 12, 2018, now U.S. Pat. No. 10,171,075, issued Jan. 1, 2019; which is a continuation of, and claims the benefit of priority under 35 USC § 120 of, commonly assigned prior U.S. application Ser. No. 15/701,304, "High Speed and High Voltage Driver", filed Sep. 11, 2017 (now U.S. Pat. No. 9,979,387 issued May 22, 2018); which is a continuation of, and claims the benefit of priority under 35 USC § 120 of, commonly assigned and prior U.S. application Ser. No. 15/066,647, "High Speed and High Voltage Driver", filed Mar. 10, 2016 (now U.S. Pat. No. 9,793,892 issued Oct. 17, 2017), the contents of which are hereby incorporated by reference herein as if set forth in full.

BACKGROUND

1. Field

Various embodiments described herein relate generally to systems, methods, and devices for use in biasing stacks of low-voltage transistors to function as high speed and high voltage drivers or inverters.

2. Description of Related Art

High speed and high voltage drivers can be used as inverters in applications where conversion from a high voltage to a lower voltage is performed. In such applications properly biased stacked transistors of an inverter can be used to allow operation of the inverter over higher voltages than a voltage handling capability of any individual transistor of the stack. Proper biasing of the transistors of the stack to allow high (switching) speed operation of the inverter while operating each individual transistor of the stack at a desired operating voltage within its voltage handling capability can be a challenging task, which is addressed in the various embodiments of the present disclosure.

SUMMARY

According to a first aspect of the present disclosure a high speed high voltage (HSHV) driver is presented, comprising: a first stack of transistors of a first type coupled between a high voltage and an output node of the HSHV driver; a second stack of transistors of a second type opposite the first type coupled between the output node and a reference voltage; a first biasing circuit configured to provide biasing voltages to the first stack, the first biasing circuit comprising a first biasing stack of transistors of the second type; and a second biasing circuit configured to provide biasing voltages to the second stack, the second biasing circuit comprising a second biasing stack of transistors of the first type, wherein: the HSHV driver operates as an inverter with an input signal having a low voltage and an output signal at the output node having the high voltage, and transistors of the first stack, the second stack, the first biasing stack and the second biasing stack having desired operating voltages substantially smaller than the high voltage.

According to a second aspect of the present disclosure a high speed high voltage (HSHV) open drain driver is presented, comprising: a stack of transistors of a first type coupled between a reference voltage and an output node of the HSHV driver; a biasing circuit configured to provide biasing voltages to the stack, the biasing circuit comprising a biasing stack of transistors of a second type; wherein: the output node is a drain node of an output transistor of the stack of transistors adapted to be coupled to a high voltage by way of a pull-up element, the HSHV driver operates as an open drain inverter with an input signal having a low voltage and an output signal at the output node having the high voltage, and transistors of the stack and the biasing stack having desired operating voltages substantially smaller than the high voltage.

According to a third aspect of the present disclosure, high speed high voltage (HSHV) open drain driver is presented, comprising: a stack of transistors of a second type coupled between a high voltage and an output node of the HSHV driver; a biasing circuit configured to provide biasing voltages to the stack, the biasing circuit comprising a biasing stack of transistors of a first type; wherein: the output node is a drain node of an output transistor of the stack of transistors, adapted to be coupled to a reference voltage by way of a pull-down element, the HSHV driver operates as an open drain inverter with an input signal having a low voltage and an output signal at the output node having the high voltage, and transistors of the stack and the biasing stack having desired operating voltages substantially smaller than the high voltage.

According to a fourth aspect of the present disclosure, a method for biasing a high speed high voltage HSHV driver is presented, the method comprising: providing a first stack of transistors of a first type coupled between a high voltage and an output node of the HSHV driver; providing a second stack of transistors of a second type opposite the first type coupled between the output node and a reference voltage; providing biasing voltages to the first stack by way of a first biasing circuit coupled to the first stack, the first biasing circuit comprising a first biasing stack of transistors of the second type; and providing biasing voltages to the second stack by way of a second biasing circuit coupled to the second stack, the second biasing circuit comprising a second biasing stack of transistors of the first type, wherein: the HSHV driver operates as an inverter with an input signal having a low voltage and an output signal at the output node having the high voltage, and transistors of the first stack, the second stack, the first biasing stack and the second biasing stack having desired operating voltages substantially smaller than the high voltage.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

This invention provides methods and devices for properly biasing stacks of transistors arranged, essentially, to be able to function as an inverter operating from a supply voltage higher than a voltage handling capability of any of the individual transistors in the stacks. In the present disclosure, such inverter, which may be used in high voltage conversion applications, such as DC/DC converters, is referred to as a high-speed high-voltage (HSHV) inverter, and can therefore be used as a driver. The present applicant has used the method of stacking transistors in applications where higher voltages than the voltage handling capability of individual transistors of the stacks are required, most notably in switch and switch-like products as well as in power amplifiers (PAs).

However, a distinguishing feature between the current invention and prior uses of stacked transistors with bias circuits is that in all the prior examples, only one polarity transistor (e.g. P-type or N-type transistor), typically NMOS, was stacked. In the current invention, both polarities, NMOS and PMOS, can be stacked, where each stack of a different polarity is stacked essentially in series with the other. Therefore, the current invention is providing the ability to operate a stack of NMOS and PMOS transistors in series with each other as a high voltage inverter wherein either one of the stacked NMOS or the stacked PMOS transistors are all ON while the other polarity is OFF.

Furthermore, the typical stack of transistors in a switch or PA can typically only operate down to a minimum frequency of operation due to the passive nature of the biasing circuits having an RC time constant requirement that must be exceeded in order to properly bias the transistors. Inverter-like circuits, on the other hand, should preferably be able to operate at any frequency, including DC. Furthermore, such circuits should be able to source and sink current from/to a power supply to/from a load.

With these differences in mind, the basic functions of the current invention can be understood more easily than by focusing on the details of the circuit implementations used, by way of example, to provide the functions of the invention.

Figure 1:
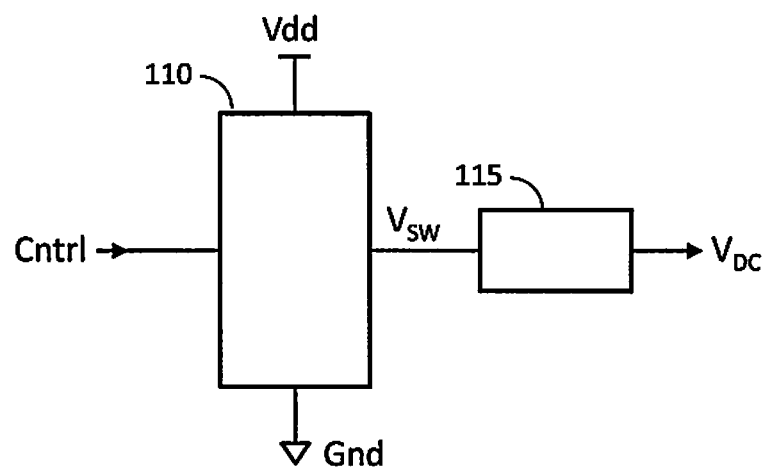
FIG. 1 shows a block diagram of a high speed, high voltage (HSHV) driver according to the present invention used to convert a high voltage to a lower voltage. Active elements of the HSHV depicted in FIG. 1 have a voltage handling capability substantially lower than the high voltage.

FIG. 1 shows a block diagram (100) of a DC/DC converter which converts a high voltage Vdd to a lower (or equal to) voltage $V_{DC}$ via an inverter (110). Under control of a frequency and duty cycle of a switching input signal, Cntrl, the inverter outputs an inverted version of the switching input signal, $V_{SW}$, which is fed to a low pass filter (115) for conversion to a DC signal, $V_{DC}$, proportional to the duty cycle of the $V_{SW}$ signal. As known to a person skilled in the art, output voltage range and resolution of the DC/DC converter depicted in FIG. 1 can depend on a lower and higher frequency of operation of the inverter (110), and therefore, it can be desirable that the inverter (110) operates from DC to higher frequency, such as 100 MHz or higher.

Figure 2A:
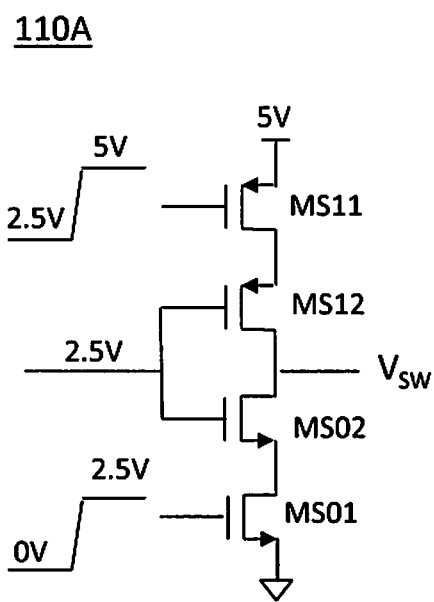
FIG. 2A shows two PMOS transistors arranged in a stack configuration and two NMOS transistors arranged in a stack configuration, where the two stacks are connected in series to provide functionality of a HSHV driver operating at 5 volts and each of the PMOS/NMOS transistors have a voltage handling capability of about 2.5 volts. Bias voltages for safe operation of the transistors are also provided in the figure.

FIG. 2A represents a circuit diagram of an inverter (110A) comprising a first stack of NMOS transistors (MS01, MS02), and a second stack of PMOS transistors (MS11, MS12), where the two opposite polarities stacks are connected in a series configuration to provide the functionality of an inverter. An output of the inverter is provided at a common node between the first and the second stack which connects a drain of a bottom PMOS transistor MS12 of the second stack to a drain of a top NMOS transistor MS02 of the first stack. Furthermore, gates of the two transistors MS02 and MS12 associated to the common node are connected. As can be seen in the circuit diagram of FIG. 2A, the second stack is coupled to a high voltage equal to 5 volts, via a source terminal of PMOS transistor MS11, and the first stack is coupled to a reference voltage (e.g. ground) via a source terminal of NMOS transistor MS01. The stacking configuration provided by the two transistors (MS11, MS12)

and (MS01, MS02) allows the stacks to each be able to operate between the high voltage and the reference voltage, where a voltage handling capability (e.g. 2.5 volts) of each of the transistors of the stacks is substantially lower than the voltage applied across the stacks during operation of the inverter.

With further reference to FIG. 2A, during operation of the inverter (110A), the second stack (MS11, MS12) and the first stack (MS01, MS02) operate in opposite phases; that is to say when the first stack is ON, the second stack is OFF and vice versa. When the second stack is ON, it provides a conduction path between the high voltage 5V at the source terminal of MS11 and an output terminal of the inverter at a common node of the first and the second stack (carrying the output voltage $V_{SW}$). When the second stack is ON, the first stack is OFF, thereby the output voltage at the output terminal is substantially equal to the high voltage 5V. At the same time, the first stack (MS01, MS02) blocks a conduction path between the common node of the output terminal and the reference voltage, thereby seeing a higher voltage than the voltage handling capability (e.g. 2.5 volts) of each of the transistors MS01 and MS02. Alternatively, when the first stack is ON, it provides a conduction path between the common node and the reference voltage at the source of MS01. When the first stack is ON, the second stack is OFF, thereby the output voltage $V_{SW}$ at the output terminal is substantially equal to the reference (low) voltage. At the same time, the second stack (MS11, MS12) blocks a conduction path between the common node of the output terminal and the high voltage 5V, thereby seeing a higher voltage than the voltage handling capability (e.g. 2.5 volts) of each of the transistors MS11 and MS12.

Exemplary gate biasing voltages for proper operation of the inverter (110A) are shown in FIG. 2A. In addition to the logical functionality of the inverter (110A) through its series connected stacks of opposite polarity, such exemplary gate biasing voltages also take into consideration voltage handling capabilities of each of the transistors of the stacks, such as not to subject, during operation of the inverter, any two terminals of a transistor (MS01, MS02, MS11, MS12) to a voltage higher than the voltage handling capability of the transistor. Accordingly, to turn OFF the first stack (MS01, MS02) and turn ON the second stack (MS11, MS12), gate biasing voltages (0V, 2.5V, 2.5V, 2.5V) are applied to gates of transistors (MS01, MS02, MS12, MS11), and to turn OFF the first stack and turn ON the second stack, gate biasing voltages (2.5V, 2.5V, 2.5V, 5V) are applied to gates of transistors (MS01, MS02, MS12, MS11).

Considering the gate biasing voltages depicted in FIG. 2A, when the first stack is ON and the second stack is OFF, transistors (MS01, MS02) are ON and transistors (MS11, MS12) are OFF. Gate voltage of 0V turns OFF transistor MS01, and voltage division of voltage $V_{SW}$ at the common drain to source node of the two transistors (MS01, MS02) sets a voltage equal to half of $V_{SW}$ at the drain of MS01 and the source of MS02. Therefore, a gate voltage of 2.5V turns OFF transistor MS02. At the same time, a gate voltage of 2.5V turns ON PMOS transistor MS11 which has a source voltage of 5V. Transistor MS11 being ON, voltage at the source of MS12 (equal to voltage at the drain of MS11) is substantially equal to the source voltage of transistor MS11, and therefore substantially equal to 5V. This allows a gate voltage equal to 2.5V to turn ON PMOS transistor MS12 and therefore provide a high output equal to 5V at the common node of the first and the second stack carrying the output voltage $V_{SW}$. Alternatively, when the first stack is OFF and the second stack is ON, transistors (MS01, MS02) are OFF and transistors (MS11, MS12) are ON. Gate voltage of 2.5V turns ON NMOS transistor MS01 thereby bringing the drain of MS01 and the source of MS02 to the reference (low) voltage, and gate voltage of 2.5V turns ON the NMOS transistor MS02 thereby bringing the voltage $V_{SW}$ at the common node of the first and the second stacks to the reference voltage. The second stack (MS11, MS12) being OFF, voltage division of a voltage across the second stack sets a voltage equal to half of the voltage across the stack (substantially equal to 2.5V) at the drain of MS11 and the source of MS12, thereby allowing a gate voltage of 2.5V to turn OFF the PMOS transistor MS12, and a gate voltage of 5V to turn OFF the PMOS transistor MS11.

As can be seen by the applied gate voltages to the first and second stacks of the inverter (110A) of FIG. 2A, the transistor MS01 of the first stack is driven by a gate voltage with levels according to desired operating voltages of the transistors of the stack (e.g. standard CMOS levels), namely in a range of [0V, 2.5V], transistor MS11 is driven by a gate voltage which is a level-shifted (shifted up by 2.5 V) version of the gate voltage used for transistor MS01, and transistors (MS02, MS12), having a common gate node, are driven by a constant DC voltage (2.5V). Implementation of the inverter (110A) will therefore require a level shifting operation to generate gate biasing of the PMOS transistor MS11.

Figure 2B:
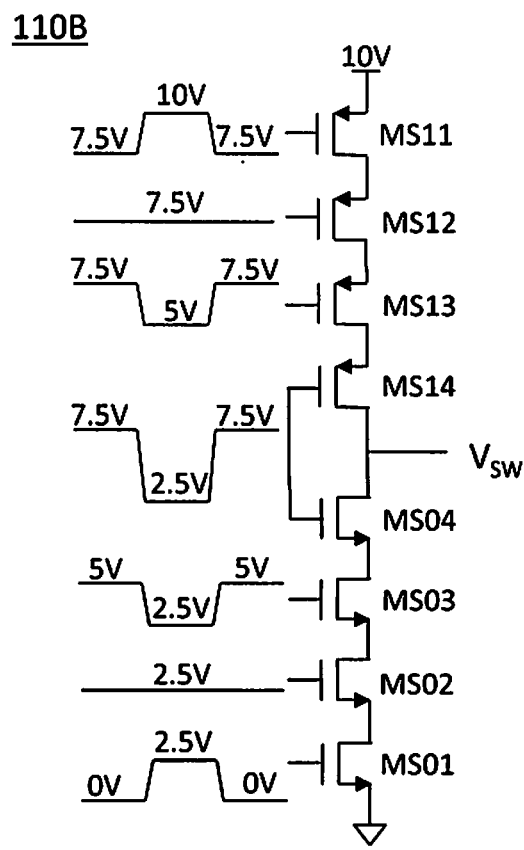
FIG. 2B shows four PMOS transistors arranged in a stack configuration and four NMOS transistors arranged in a stack configuration, where the two stacks are connected in series to provide functionality of a HSHV driver operating at 10 volts and each of the PMOS/NMOS transistors have a voltage handling capability of about 2.5 volts. Bias voltages for safe operation of the transistors are also provided in the figure.

FIG. 2B represents a circuit diagram of an inverter (110B) with a stacked based structure similar to the structure of the inverter (110A) of FIG. 2A, where the first stack and the second stack of the inverter (110B) each comprise four transistors instead of the two transistors used in the stacks of the inverter (110A). Accordingly, the inverter (110B) can operate over a higher voltage as compared to the inverter (110A), as each of the first NMOS stack (MS01-M504) and the second PMOS stack (MS11-MS14) of the inverter (110B) can withstand a higher voltage. Using the same transistor devices as used in the inverter (110A), inverter (110B) can operate over a high voltage, 10V, while its constituent transistors have a voltage handling capability of 2.5V.

Principle of operation of the inverter (110B) is similar to one of the inverter (110A) discussed above, where the two stacks operate in opposite phases. Similarly to operation of the inverter (110A), proper operation of the inverter (110B) is provided via proper biasing of the transistors of the stack which must take into consideration the voltage handling capabilities of each of the transistors as discussed above. Accordingly, exemplary gate biasing voltages for proper operation of the inverter (110B) are shown in FIG. 2B. To turn OFF the first stack (MS01, MS02, MS03, MS04) and turn ON the second stack (MS11, MS12, MS13, MS14), gate biasing voltages (0V, 2.5V, 5V, 7.5, 7.5V, 7.5V, 7.5V, 7.5V) are applied to gates of transistors (MS01, MS02, MS03, MS04, MS14, MS13, MS12, MS11), and to turn OFF the second stack and turn ON the first stack, gate biasing voltages (2.5V, 2.5V, 2.5V, 2.5V, 2.5V, 5V, 7.5V, 10V) are applied to gates of transistors (MS01, MS02, MS03, MS04, MS14, MS13, MS12, MS11).

As can be seen by the applied gate voltages to the first and second stacks of the inverter (110B) of FIG. 2B, the transistor MS01 of the first stack is driven by a gate voltage with levels according to desired operating voltages of the transistors of the stack (e.g. standard CMOS levels), namely in a range of [0V, 2.5V], transistor MS11 is driven by a gate voltage which is a level-shifted (shifted up by 7.5V) version of the gate voltage used for transistor MS01, transistors (MS02, MS12) are driven by different DC voltages, and transistors (MS03, MS04, MS13, MS14) are driven by gate voltages having two different levels, depending on an ON state or OFF state of the associated transistor, and which can be a function (amplification, inversion, level shift) of the signal applied to the gate of the NMOS transistor MS01.

Driving the gates of the transistors of the first stack and the second stack of the inverter (110B) according to the voltages shown in FIG. 2B at high switching speeds can be a challenge, as any misalignment in the applied gate voltages can generate voltage differentials across terminals of the transistors exceeding the voltage handling capability of the transistors and therefore causing potential damage to the transistors. Biasing methods and circuits according to the various embodiments of the present disclosure address such challenge and can therefore allow design and implementation of an HSHV inverter using three, four, five, six, seven, eight or higher transistors in each of the first stack and the second stack.

In particular, the biasing circuits according to the present disclosure can take advantage of certain biasing voltage patterns apparent in the embodiments depicted in FIGS. 2A and 2B. In particular, based on the biasing voltages applied to the gates of the inverters (110A) and (110B), one can see that to turn ON the first stack, all associated NMOS transistor gates are driven by a voltage equal to 2.5V (or 2.5V above the source voltage of transistor MS01), and to turn ON the second stack, all associated PMOS transistor gates are driven by a voltage equal to 7.5V (or 2.5V below the source voltage of transistor MS11). Furthermore, one can see that to turn OFF the first stack, gate voltage to the transistors of the first stack increase by a step voltage equal to 2.5V starting from the bottom NMOS transistor MS01 coupled to the reference voltage, such as (MS01, MS02, MS03, MS04, . . . )=(0V, 2.5V, 5V, 7.5V, . . . ), and in a same fashion, to turn OFF the second stack, gate voltage to the transistors of the second stack decrease by a step voltage equal to (−)2.5V starting from the top PMOS transistor MS11 coupled to the high voltage 10V, such as ( . . . , MS11, MS12, MS13, MS14)=( . . . , 10V, 7.5V, 5V, 2.5V). It is further noted that gate biasing of the transistors of the first and the second stack with respect to an output state change of the inverter follow a symmetry around the common node (output of the inverter), such as any two transistors (one of each stack) at a same distance from the common node see a same step change, in magnitude and polarity, of a corresponding gate voltage for a switch in output state of the inverter. This can be seen, for example, in FIG. 2B, where step change in the gate voltage of transistor pairs (MS01, MS11), (MS02, MS12), (MS03, MS13) and (MS04, MS14) are equal for a change in output state of the inverter (110B). It is further noted that magnitude of such step changes are in relation to an equal distribution of a voltage across each of the transistor stacks when in the OFF state, such as, for example, in the case of the inverter (110B) operating over a voltage of 10V and using four transistors in each of the first/second stack, the step change equals to 10/4=2.5V.

Figure 3A:
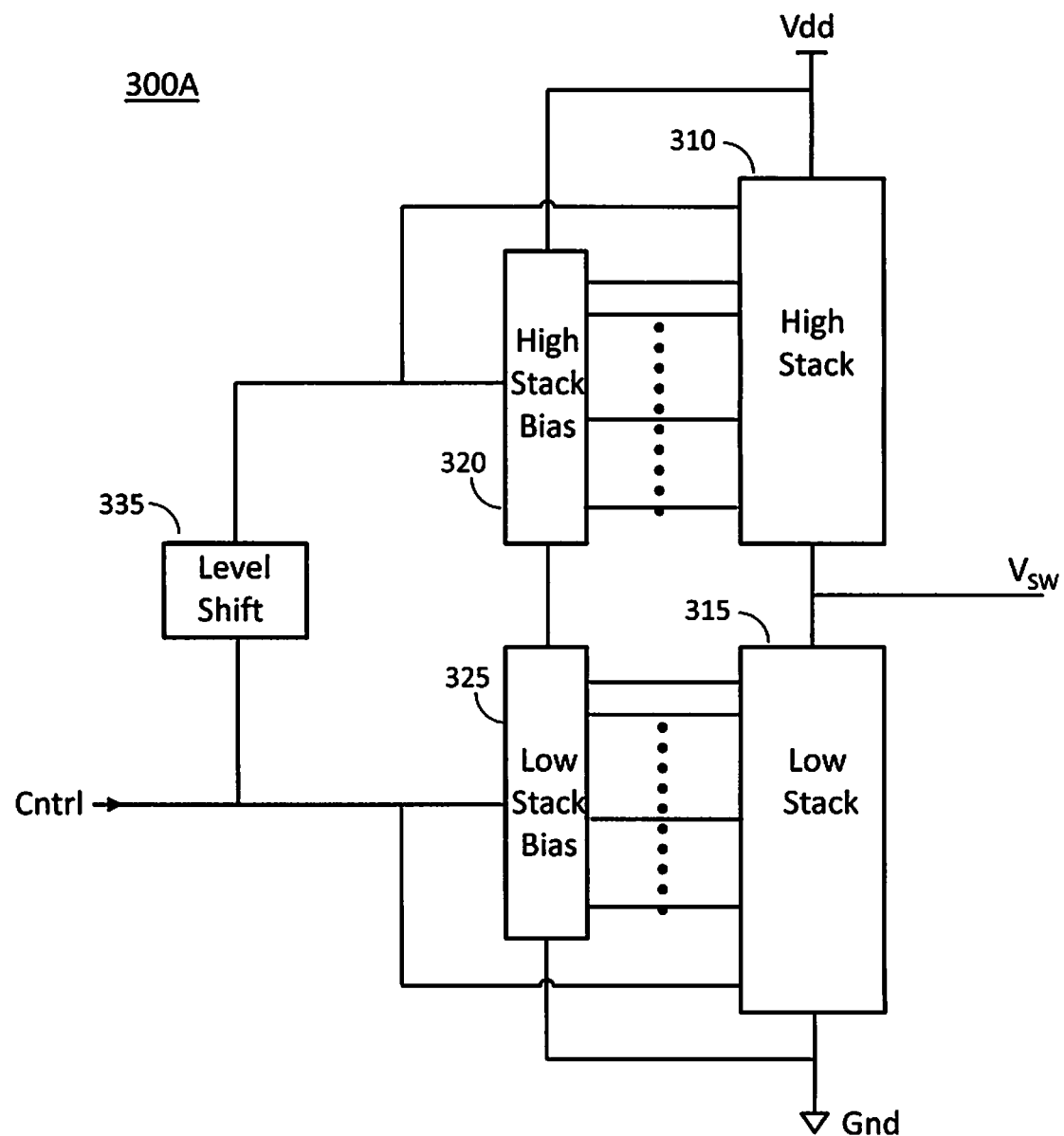
FIGS. 3A-3C show block diagrams of exemplary HSHV drivers according to the present disclosure, comprising a level shifter, a high side transistor stack and corresponding biasing circuit, and a low side transistor stack and corresponding biasing circuit.
Figure 4A:
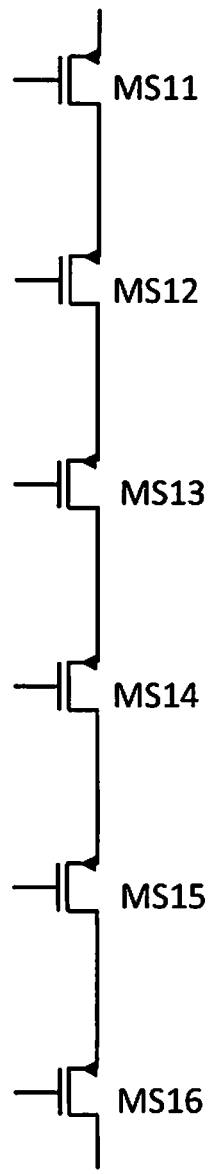
FIGS. 4A-4D show transistor stacks for use in the exemplary HSHV drivers of FIGS. 3A-3C.
Figure 4B:
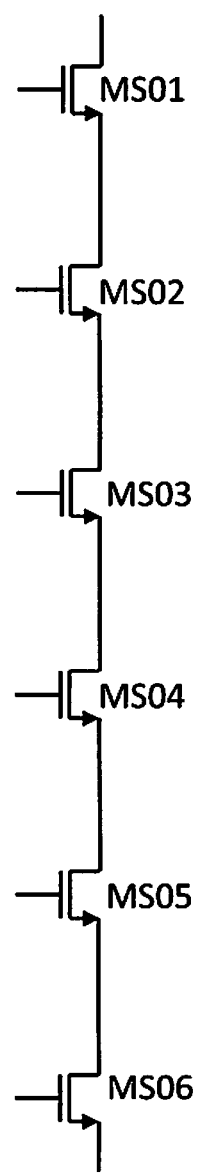
Figure 4C:
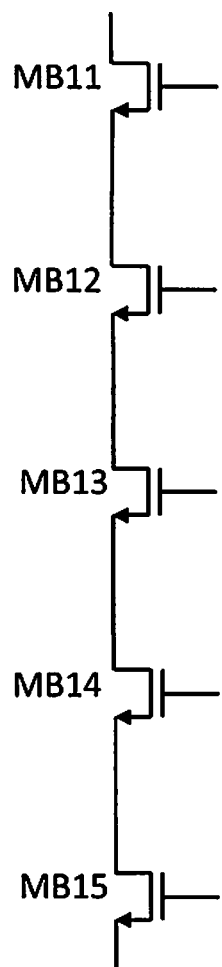
Figure 4D:
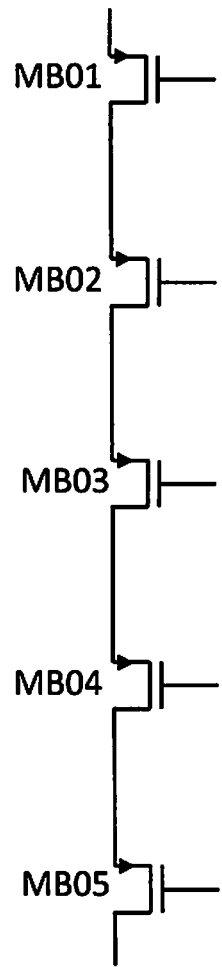

FIG. 3A represents a block diagram of an HSHV inverter (300A) according to an embodiment of the present disclosure, which comprises a high stack circuit (310) comprising a stack of PMOS transistors (e.g. FIG. 4A), biased via a corresponding high stack bias circuit (320) comprising a stack of NMOS transistors (e.g. FIG. 4C), and a low stack circuit (315) comprising a stack of NMOS transistors (e.g. FIG. 4B) biased via a low stack bias circuit (325) comprising a stack of PMOS transistors (e.g. FIG. 4D). The high stack circuit (310) is coupled to the low stack circuit (315) at a common node, which is an output terminal of the HSHV inverter (300A), that carries an output voltage $V_{SW}$. The HSHV inverter (300A) operates between a high voltage Vdd, coupled to the high stack circuit (310), and a low reference voltage (Gnd), coupled to the low stack circuit (315); that is to say the output voltage $V_{SW}$ of the HSHV inverter (300A) swings between the high voltage Vdd and the low reference voltage (Gnd) under control of the input signal voltage Cntrl. The input signal, Cntrl, is fed to the low portion (315, 325) of the inverter (300A), and a level shifted version of the input signal, via level shift circuit (335), is fed to the high portion (310, 320) of the inverter (300A). Principle of operation of the stack based inverter (300A) is similar to operation of the stack based inverters (110A, 100B) discussed above, where the high stack and the low stack operate out of phase, one being ON while the other being OFF, thereby pulling the output node carrying the output signal $V_{SW}$ either high to Vdd, or low to the reference voltage (ground), under control of the input signal Cntrl. The high stack bias circuit (320) and the low stack bias circuit (325) ensure proper biasing of the transistors of the high stack (310) and the low stack (315) respectively.

With further reference to FIG. 3A, according to an embodiment of the present disclosure, the level shift circuit (335) shifts up the DC voltage of the input signal, Cntrl, so as to allow a shifted version of the input signal, Cntrl*, to turn ON/OFF a transistor of the high stack (e.g. MS11 of FIG. 5C) coupled to the high voltage Vdd. In an exemplary embodiment of the present disclosure, the shifted input signal, Cntrl*, is equal to Vdd when the input signal, Cntrl, is in its high state (e.g. 2.5V).

Figure 3B:
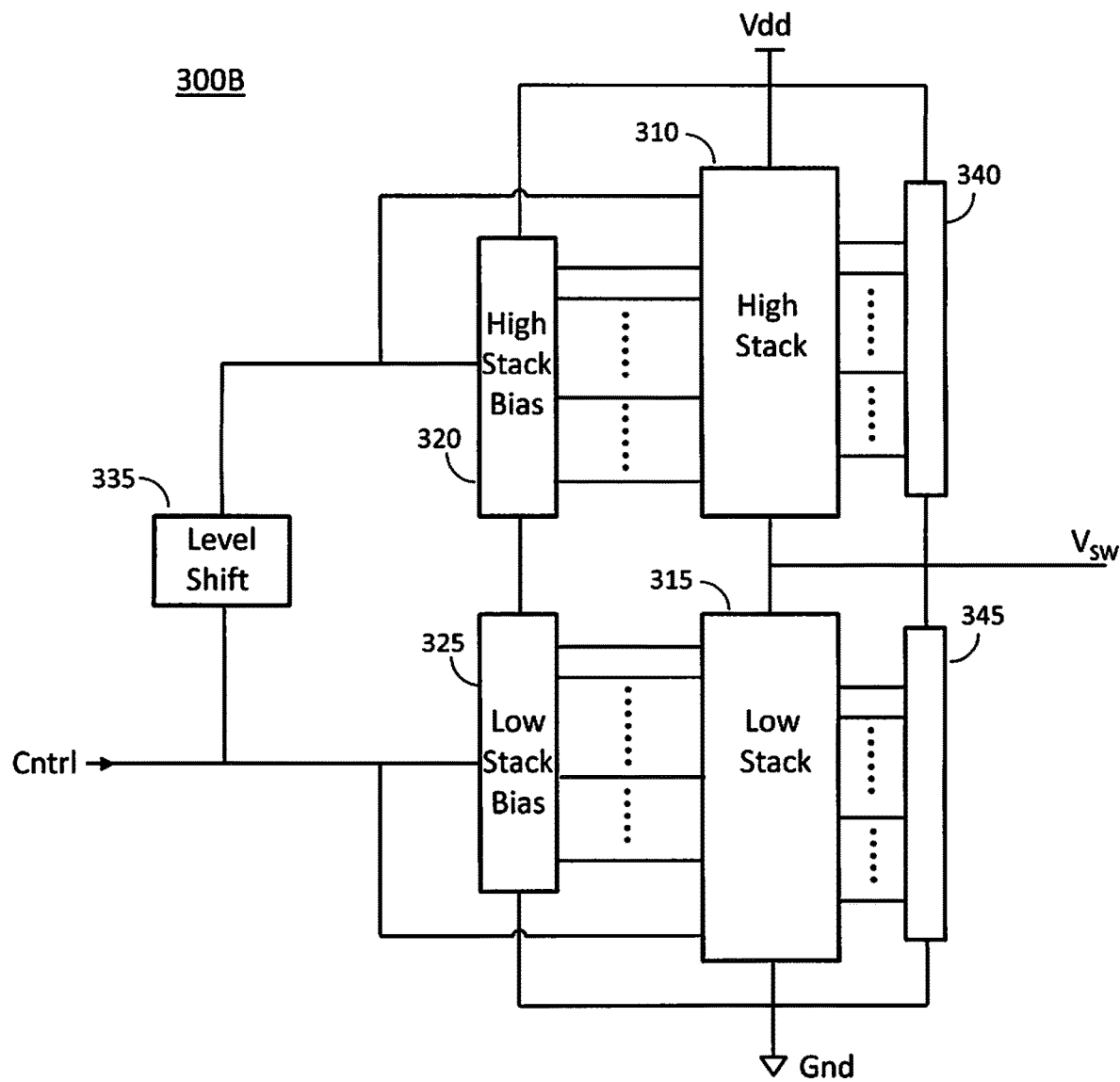

FIG. 3B represents a block diagram of an HSHV inverter (300B) according to an embodiment of the present disclosure which is similar to the HSHV inverter (300A) of FIG. 3A, with the addition of further biasing circuits (340) and (345) for respective biasing of the high stack (310) and the low stack (315). Such additional biasing circuits can comprise a combination of transistors, capacitors and resistors, as shown, for example, in FIGS. 5C-5D, 6A-6B and 7A-7B, which can help, in combination with the stack biasing circuits (320, 325), in establishing the proper biasing voltages for the high/low stacks (310, 315) and corresponding transition voltages between switching states of the high/low stacks (310, 315), as dictated by the input signal, Cntrl.

Figure 3C:
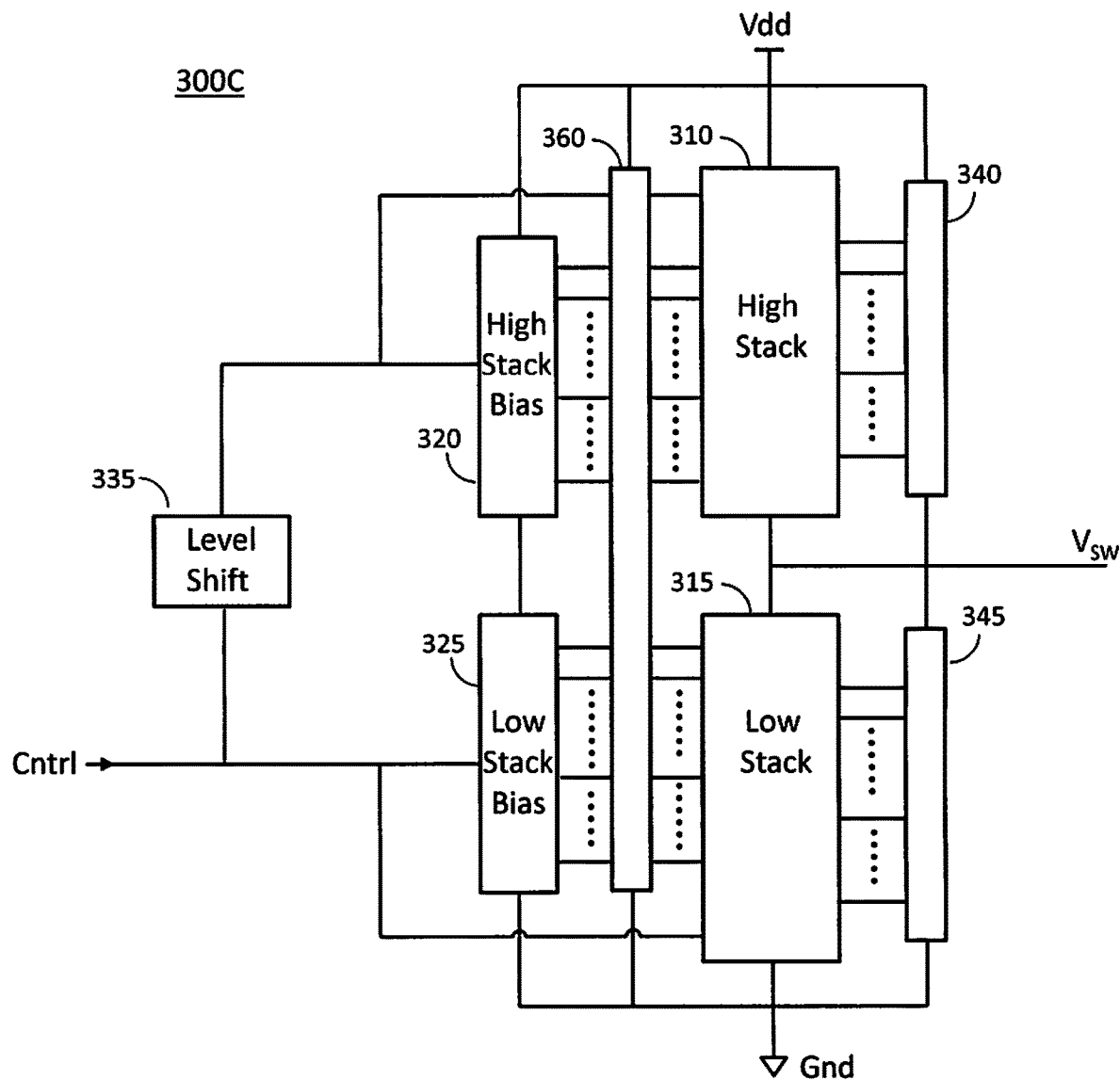

FIG. 3C represents a block diagram of yet another embodiment of an HSHV inverter (300C) according to the present disclosure, which includes an additional biasing circuit (360) which operates between the high/low stack bias circuits (320, 325) and the high/low stack circuits (310, 315). According to an exemplary embodiment of the present disclosure, the additional biasing circuit (360) can comprise capacitors (e.g. 360A, 360B of FIG. 5C) connecting nodes of a same high (310, 320) or low (315, 325) circuit portion of the HSHV inverter (300C), and capacitors (e.g. 360C of FIG. 5C) connecting nodes of the high stack/stack bias circuits (310, 320) to nodes of the low stack/stack bias circuits (315, 325). Capacitors (360C) can serve as strapping capacitors to strap low impedance and high impedance node pairs which have a same voltage swing (magnitude and phase) during an ON/OFF or OFF/ON transition associated to the switching of the inverter. As common source-drain nodes during an ON state of a stack are at low impedance and common source-drain nodes during an OFF state of a stack are at high impedance, strapping the nodes of the high/low stacks via capacitors (360C) can provide a low impedance path to the high impedance nodes for a fast switching.

Figure 5A:
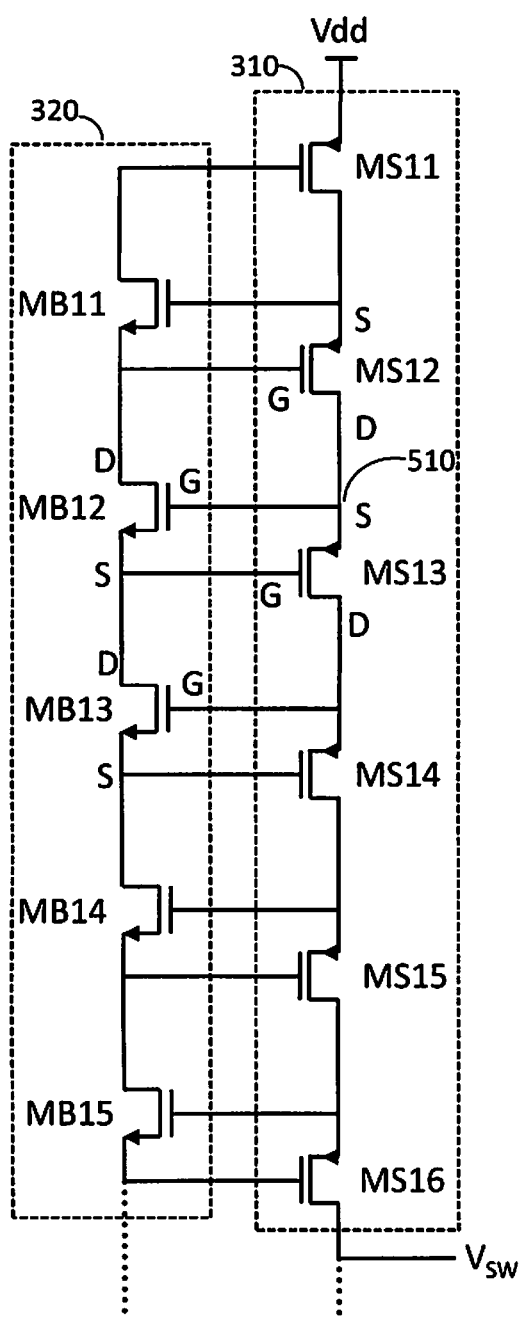
FIGS. 5A-5B show interconnection between a biasing transistor stack and a main transistor stack of the exemplary HSHV drivers of FIGS. 3A-3C.
Figure 5B:
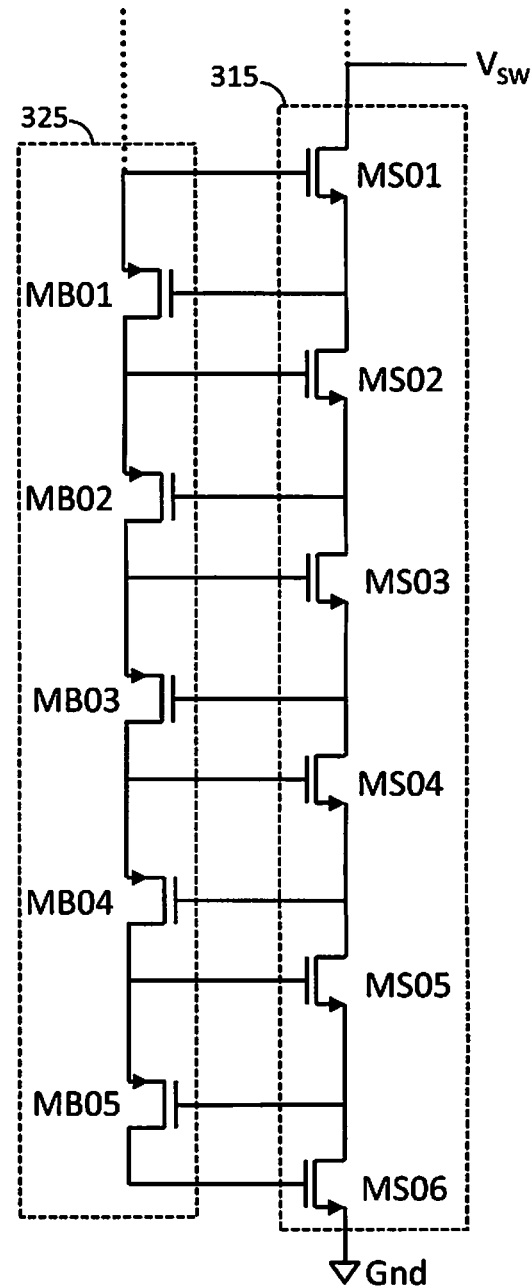
Figure 6A:
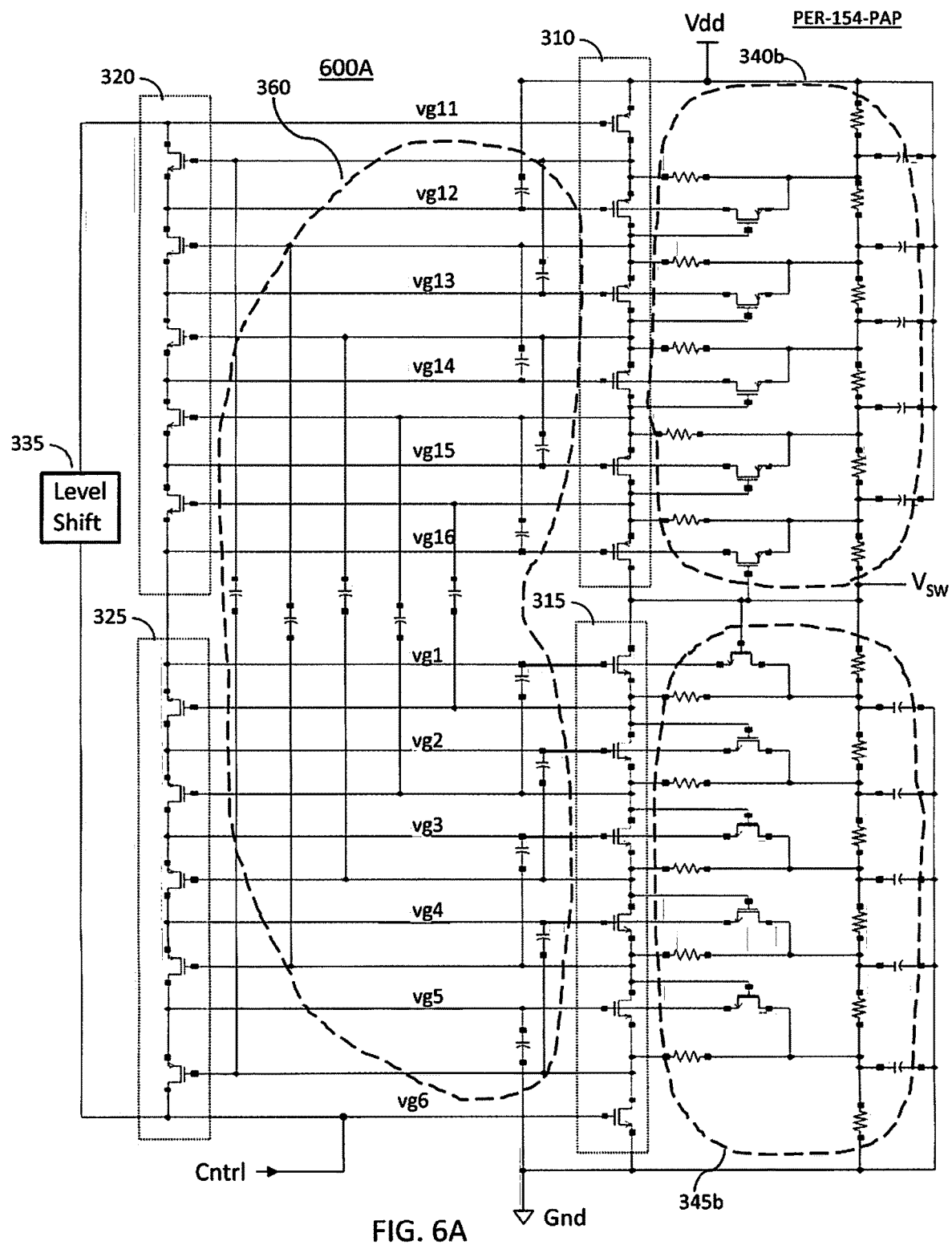
FIG. 6A represents a circuit diagram of an exemplary second embodiment HSHV driver according to the present disclosure.
Figure 6B:
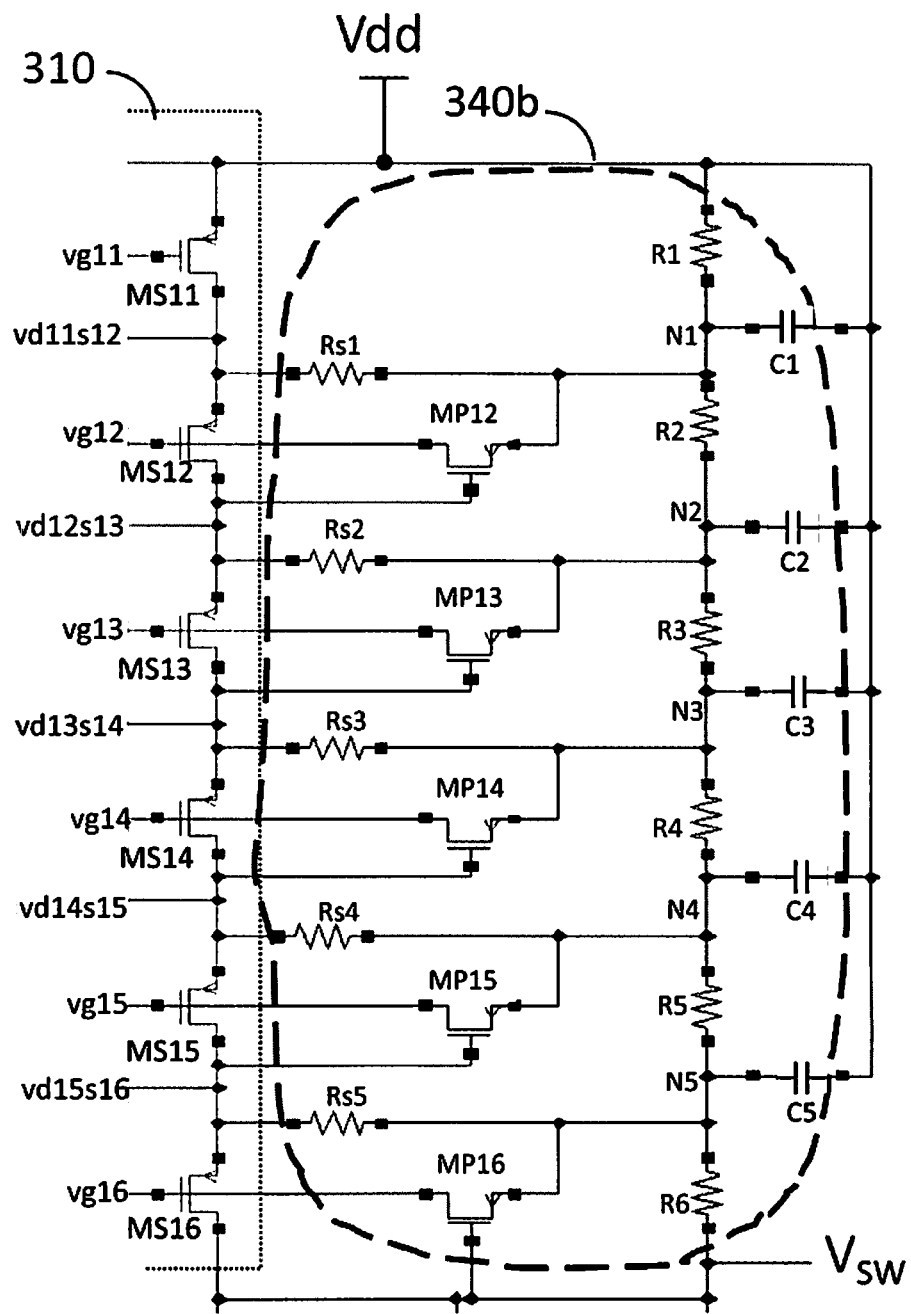
FIG. 6B is an enlarged view of a section of the circuit diagram of FIG. 6A.

Based on the described block diagrams of FIGS. 3A-3C, it can be seen that the HSHV inverter according to the various embodiments of the present disclosure comprises a first stack and a second stack of transistors, denoted the low stack (315) and the high stack (310) in the various figures of the present disclosure, where the stacks comprise transistors of opposite polarities as depicted, for example, in FIGS. 6A-6B. Each stack further comprises associated biasing circuits (e.g. 340, 345, 360), comprising transistors and passive elements, most notably capacitors and resistors. In addition, stacks of biasing transistors (320, 325) are added that are opposite in polarity to the stacked transistors they bias. Specifically, a stack of PMOS transistors (e.g. 325 of FIGS. 3A-3C, 4D, 5B, 6A, 6B) is used to bias the NMOS transistors of the low stack (315) of the HSHV inverter according to the present disclosure; and a stack of NMOS transistors (e.g. 320 of FIGS. 3A-3C, 4C, 5A, 6A, 6B) is used to bias the PMOS transistors of the high stack (310) of the HSHV inverter according to the present disclosure.

The HSHV inverter according to the present invention, such as inverter 300A-300C, uses stacked transistors of different polarities to pull the output node of the inverter high (Vdd) or low (Gnd). According to an exemplary embodiment of the present disclosure, the high stack (310) comprises PMOS FET transistors (MS11-MS16) arranged in a stacked configuration as depicted in FIG. 4A, and the low stack (315) comprises NMOS FET transistors (MS01-M506) arranged in a stacked configuration as depicted in FIG. 4B. Similarly, biasing of the high/low stacks (310/315) comprises coupling of the high/low stacks with stacked transistors of opposite polarity to the polarity of the stacks they bias. For example, the high stack bias circuit (320), which is used to bias the PMOS high stack (310), is shown in FIG. 4C, and the low stack bias circuit (325), which is used to bias the NMOS low stack (320), is shown in FIG. 4D. As can be seen in FIGS. 4C-4D, the high stack bias circuit (320) comprises NMOS FET transistors (MB11-MB15) arranged in a stacked configuration (also known as series configuration), and the low stack bias circuit (325) comprises PMOS FET transistors (MB01-MB05) arranged in a stacked configuration. It should be noted that the exemplary case of six stacked transistors used in each of the high/low stacks (310/320) should not be considered as limiting the scope of what the inventor considers his invention, as different stack heights can be used to address, for example, different switching voltage levels at the output of the HSHV inverter according to the present disclosure.

Coupling of the high stack (310) and the low stack (315) to the corresponding high stack bias circuit (320) and the low stack bias circuit (325) is shown in FIGS. 5A and 5B respectively. FIG. 5A shows the PMOS transistors (MS11-MS16) of the high stack (310) arranged in a stacked configuration, where interconnection of the transistors is provided via connection of a drain (D) of a transistor to a source (S) of an adjacent transistor, thereby providing common source-drain nodes (510) between the adjacent transistors in the stack (e.g. MS12, MS13). The stacked arrangements (315, 320, 325) provide similar common source-drain nodes (510) created via interconnections of the transistors in the stacks. As can be seen in FIG. 5A, five stacked NMOS transistors (MB11-MB15) of the high stack bias circuit (320) are used to bias six stacked PMOS transistors (MS11-MS16) of the high stack (310), where the gates (G) of the PMOS transistors (MS12-MS15) are connected to common source-drain nodes of the high stack bias circuit (320), and the gates (G) of the NMOS transistors (MB11-MB15) are connected to common source-drain nodes of the high stack (310), exception being the topmost and the bottommost transistors MS11 and MS16 of the high stack (310), where the gate of MS11 is connected to the drain of the topmost transistor MB11 of the high bias stack (320) and the gate of MS16 is connected to the source of the bottommost transistor MB15 of the high bias stack (320). As a consequence of the coupling between the high stack (310) and the high stack bias circuit (320), common source-drain nodes (510) of the high stack (310) are each connected, from top to bottom, to a corresponding gate of the high stack bias circuit (320), from top to bottom. Similarly, and as shown in FIG. 5B, coupling between the low stack (315) and the corresponding low stack bias circuit (325) is performed via connections of gates and common source-drain nodes (510) of the stacks, in a top to bottom sequence.

Figure 5C:
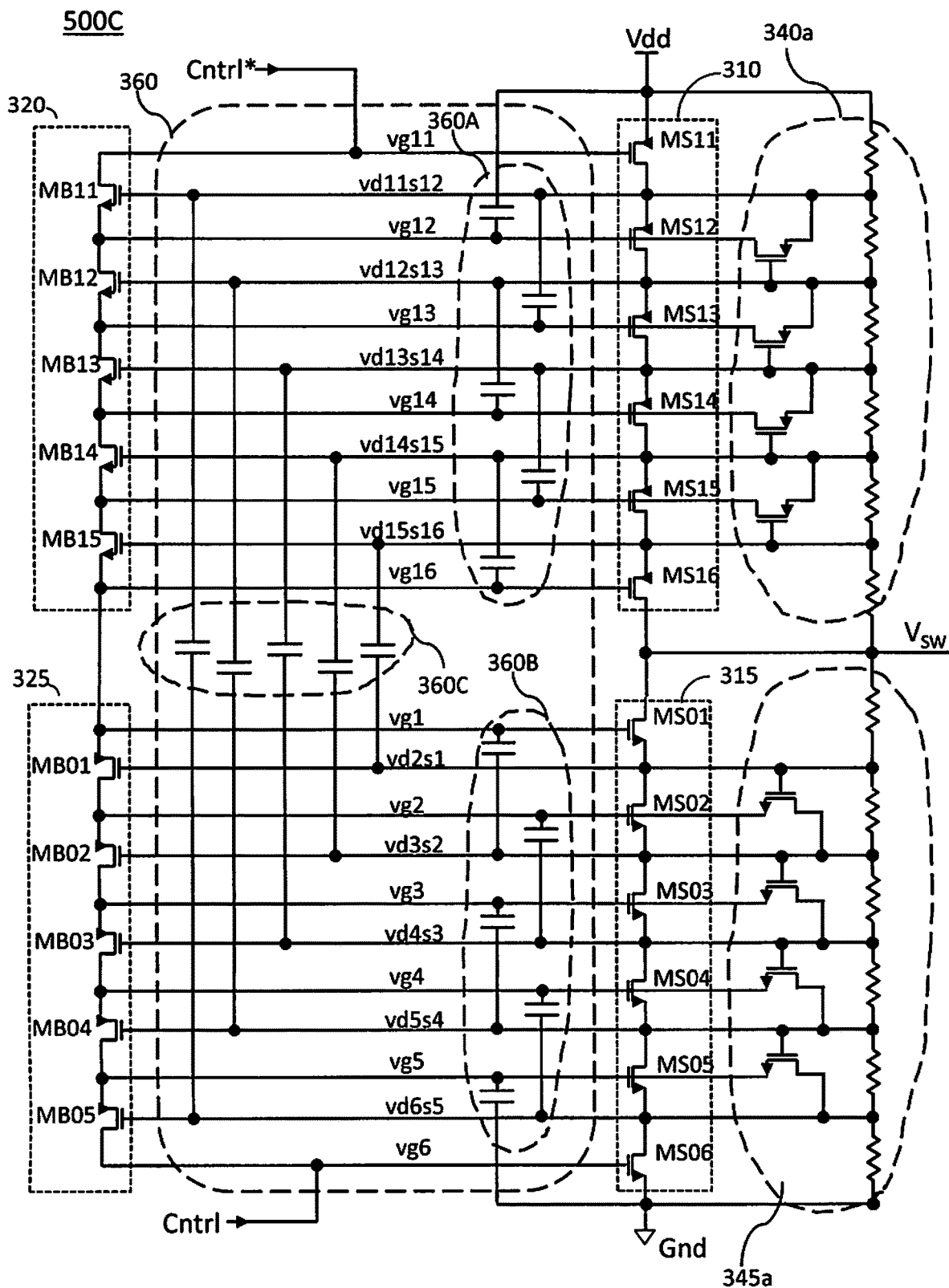
FIG. 5C represents a circuit diagram of an exemplary first embodiment HSHV driver according to the present disclosure.

FIG. 5C represents a first embodiment of an HSHV inverter (500C) according to the present disclosure, including strapping capacitors (360A, 360B, 360C) used to strap various nodes of the transistor stacks (310, 315, 320, 325), and biasing circuits (340a, 345a) used to further assist in providing the proper bias voltages (DC) to the high/low stacks (310, 315). The basic operation of the biasing stacks (320, 325) used to bias stacks (310, 315) can be understood from the circuit schematics of FIG. 5C, by simply following how the transistors turn ON and OFF in response to a change of state of the input signal, Cntrl (and its level shifted version Cntrl*), which is typically provided separately from a pulse width modulator, PWM.

It should be noted that desired operating voltages of transistors may be chosen such that transistors have specific performance. In general, the voltages across given nodes of transistors are often controlled to certain desired operating voltages below the voltage handling capabilities of the transistors based on reliability limits of the technology. The reliability limits for a specific device in a certain technology may vary based on parameters such as the device type, device size, desired lifetime, operating temperature, and desired performance characteristics.

With further reference to the HSHV inverter (500C) of FIG. 5C, let's consider first the case where the output $V_{SW}$ node is in the high state. As there are six transistors in each of the high/low stacks (310/320) with each transistor having a desired operating voltage of 2.5V (e.g. each transistor can handle 2.5V across its drain and source nodes), the high state can be as high as 15V and can be provided by the voltage at Vdd.

When the exemplary HSHV inverter (500C) output is in the high state, with $V_{SW}$ equal to 15V, the PMOS high stack (310) is ON, with the gate voltages of all its PMOS transistors (MS11-MS16) to about 12.5V and voltages at the common source-drain nodes (vd15s16-vd11s12 as shown in FIG. 5C) to 15V, and the NMOS high stack bias (320) is ON, with gate voltages of all its NMOS transistors (MB11-MB15) to 15V (as these are connected to the common source-drain nodes of the stack (310)) and voltages at the common drain-source nodes of NMOS transistors (MB11-MB15) equal to the about 12.5V (as these are connected to the gates of the stack (310)). At the same time, the NMOS low stack (315) and the PMOS low stack bias (325) are both OFF, with a gate-to-source voltage, Vgs, of NMOS transistors (MS01-MS06) and PMOS transistors (MB01-MB06) roughly equal to 0V, and drain-to-source voltage, Vds, of NMOS transistors (MS01-MS06) of about 2.5V (equal division of voltage at $V_{SW}$ across the transistors of the stack (315)).

When the HSHV inverter (500C) is in the high state, the input signal, Cntrl, is in the low state. Let's assume a transition of the input signal, Cntrl, from the low state to a high state (e.g. 2.5V) and consider its effect on the lower stack (315) and associated biasing stack (325). To be noted that such transition of the input signal, Cnrtl, causes a same transition (equal in magnitude and polarity) on the shifted version of the input signal, Cntrl*, provided to the high stack (310), where a low level of the Cntrl* signal is 12.5V and a high level is 15V. As the input signal is coupled to the gate of the NMOS transistor MS06 of the low stack (315), the transition of the input signal turns ON MS06, causing the drain of MS06 (node vd6s5) to transition from 2.5V down toward 0V (Gnd). Assuming that a threshold voltage, Vth, of the NMOS transistors and the PMOS transistors used in the HSHV inverter (500C) is equal to 0.5V and −0.5V respectively, once voltage at node vd6s5 reaches 2.0V, transistors MS05 and MB05 both start to turn ON because their respective threshold voltages is reached (Vgs of MS05>0.5V and Vgs of MB05<−0.5V). Since gate voltage at node vg5 of MS05 is already at around 2.5V, MB05 turning ON does not cause a transition at vg5, but MS05 turning ON causes its drain voltage (node vd5s4) to drop toward the source voltage of MS05. Once the voltage at node vd5s4 drops below 4.5V, MS04 and MB04 start to turn ON. Turning ON of MS04 causes voltage at node vd4s3 to drop, and MB04 turning ON causes voltage at node vg4 to drop. Once vd4s3 voltage drops below 7V, MS03 and MB03 start to turn ON, and the same process repeats itself and ripples all the way up to sequentially turn ON (MS02, MB02) and (MS01, MB01).

Therefore the low to high transition of the input signal, Cntrl, results in turning ON all the lower stack (315) NMOS transistors (MS01-M506), in sequence, starting from the bottommost transistor of the stack, MS06, and ending with topmost transistor of the stack, MS01. Also, biasing stack transistors (MB01-MB05) turn ON following a similar sequence as each transistor (MB05, MB04, MB03, MB02, MB01) is turned ON at the same time as an associated transistor (MS05, MS04, MS03, MS02, MS01) of the lower stack (315). When settled in the ON state, lower stack (315) transistors (MS01-M506) have their source and drain nodes at a voltage of 0V and their gate nodes (vg1-vg6) at a voltage of 2.5V, whereas the transistors (MB01-MB05) of the lower stack bias circuit (325) have their source and drain nodes at a voltage of 2.5V and their gate nodes at a voltage of 0V.

The same transition of the input signal, Cntrl, to the HSHV inverter (500C) causes a transition, from a low state to a high state, of the level shifted signal, Cnrtl*, fed to the high stack (310) and to the associated high stack biasing circuit (320). This transition causes a similar sequence of events in the high stack (310) and the high stack biasing stack (320) which ripple through these stacks in a top-bottom manner (starting from MS11 turning OFF), and in synchrony with the bottom-up sequence of events described above in relation to a response of the low stack (315) and associated low stack biasing circuit (325) to a change of state of the input signal, Cntrl. As transistors in the bottom half portion (315, 325) of the HSHV inverter (500C) turn ON sequentially in a bottom-up manner, transistors in the top half portion (310, 320) of the HSHV inverter (500C) turn OFF sequentially in a top-down manner. The combined effect of the two synchronized sequence of events in the top and bottom portions of the HSHV inverter (500C) is the stepping down of the output voltage $V_{SW}$, from a high state, Vdd, to a low state, Gnd.

As described above, the HSHV inverter (500C) according to the present disclosure comprises symmetrically identical nodes in the top half and the bottom half portions which see a same voltage step change in response to a change in the state of the input signal, and therefore such nodes move up/down, in synchrony, by a same voltage. Nodes (vd6s5, vd11s12), (vd5s4, vd12s13), (vd4s3, vd13s14), (vd3s2, vd14s15), and (vd2s1, vd15s16), which are at different DC voltage levels, are coupled to each other via strapping capacitors (360C) which allow to immediately couple a voltage change from one node (low impedance) to the other node (high impedance) while blocking a corresponding DC voltage, and therefore ensure synchronous and high-speed transitions to a desired bias voltage level (by providing a low impedance path to the high impedance node). Strapping of nodes, via for example the strapping capacitors (360C), is required to maintain, throughout a state transition phase of the inverter, proper voltages to the transistors of the HSHV inverter (500C) such as to not subject the transistors to voltages higher than their desired operating voltage.

Similarly, strapping capacitors (360A-360B) couple nodes to each other (as shown in FIG. 5C) which immediately couple a voltage change from one node to the other node while blocking a corresponding DC voltage, and therefore ensure synchronous and high-speed transitions to a desired bias voltage level. These capacitors (360A-360B) specifically couple drain/source nodes to gate nodes.

Figure 5D:
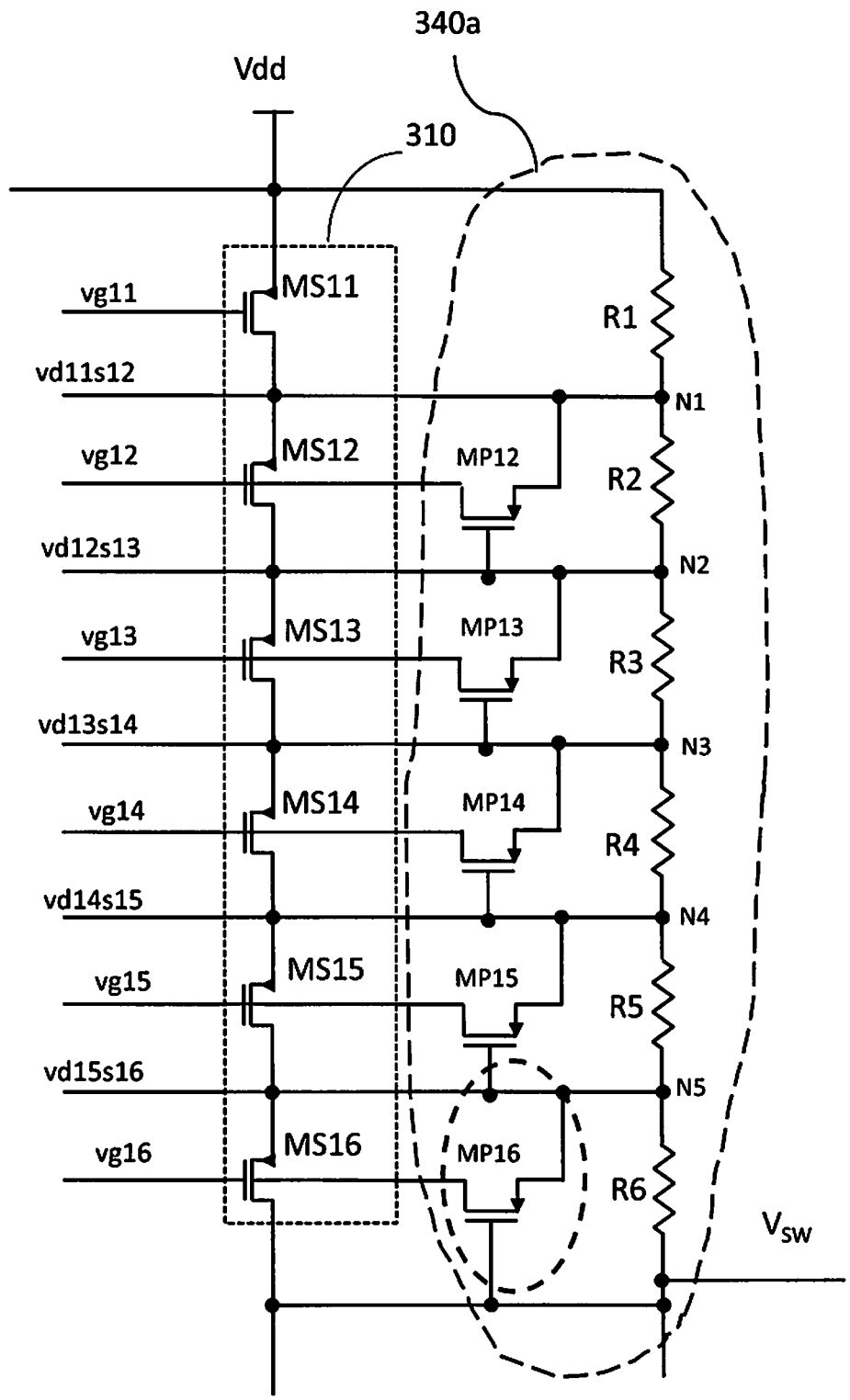
FIG. 5D is an enlarged view of a section of the circuit diagram of FIG. 5C.

As shown in FIG. 5C, and FIG. 5D which represents an enlarged view of the high stack (310) and corresponding biasing circuit (340a), resistors (R1-R6) arranged in a resistive voltage divider configuration between the supply Vdd and the common node (carrying the output voltage $V_{SW}$) provide the required DC bias voltages to the nodes (vd11s12-vd15s16, vg12-vg16) of the high stack (310) for proper biasing of the transistors (MS11-MS16) during the OFF state of the high stack (310). The resistively divided voltage obtained at each common node (N1-N5) of the resistors (R1-R6) is directly (e.g. resistively) provided to the common source-drain nodes (vd11s12-vd15s16) and to the gate nodes (vg12-vg15) through PMOS transistors (MP12-MP15) (e.g. through transistor coupling). In a case where transistor MP16 is provided, as shown in FIG. 5D, node N5 also provides biasing voltage to the gate node vg16 through the PMOS transistor MP16. Biasing circuit (345a), coupled to the low stack (315), has similar interconnecting components to the biasing circuit (340a) to provide same functionality to the low stack (315), except that the biasing circuit (345a) uses NMOS transistors instead of the PMOS transistors (MP12-MP15) of the biasing circuit (340a), as shown in FIG. 5C.

With further reference to FIGS. 5C and 5D, it should be noted that transistor MP16, shown in a dotted circle in FIG. 5D, is not necessary in the operation of the circuit (340a), as biasing of the gate of transistor MS16 (vg16) of the high stack (310), when the high stack is in the OFF state, is provided by the low stack bias circuit (325) which biases the low stack (315), the low stack (315) being in the ON state and therefore the low stack bias circuit (325) also being in the ON state. The person skilled in the art will recognize that existence of the transistor MP16 has little to no impact to the operation of the circuit because the ON state of the low stack bias circuit (325) can easily over-drive the MP16 "on" path since MP16 comes from a high impedance resistor stack (e.g. R1-R5). The various exemplary embodiments of the HSHV inverter of the present disclosure can therefore be made with or without a transistor MP16 (and equivalent for the low stack). However, in a case where only half of the circuit represented in FIG. 5C is used, such as the exemplary cases of a pull-up mode and/or a pull-down mode described in later sections of the present disclosure (e.g. FIG. 10), transistor MP16 is required to bias the gate of the transistor MS16 of the stack.

FIG. 6A represents a circuit diagram of an HSHV inverter (600A) according to a second embodiment of the present disclosure which uses capacitive division to reduce the total capacitance used to properly biasing (and protecting) the gates of the transistors of the high stack (310) and the low stack (315). The person skilled in the art will recognize that the circuit diagram of FIG. 6A is a build up from the circuit diagram of FIG. 5C, where biasing circuits (340b) and (345b) include additional capacitors and resistors to allow proper biasing of the stacks while reducing total capacitance of the circuit. In the exemplary case of six transistors in each of the stacks (310/315), the total capacitance used in the HSHV inverter (600A) of FIG. 6A is about 12.5 pF as compared to the total capacitance of 120 pF used in the HSHV inverter (500C) of FIG. 5C.

Capacitive division in the HSHV inverter (600A) of FIG. 6A is provided via the circuit (340b) for the high stack (310) and via the circuit (345b) for the low stack (315). FIG. 6B represents a diagram of the circuit (340b), comprising a plurality of resistors (R1-R6, Rs1-Rs5), a plurality of capacitors (C1-C5) and a plurality of PMOS transistors (MP12-MP16) interconnected and coupled to nodes of the high stack (310) to provide the required bias voltage levels to the transistors of the high stack (310). It should be noted that the circuit (345b) coupled to the low stack (315) has similar interconnecting components to the circuit (340b) to provide same functionality to the low stack (315), except that it uses NMOS transistors instead of the PMOS transistors (MP12-MP16).

With further reference to the circuit (340b) represented in FIG. 6B, equal division of a voltage across the high stack (310) to provide a substantially same voltage across each of the transistors (MS11-MS16) of the stack during a steady state operation of the inverter (600A) as well as during a state transition phase (e.g. from low to high output state or vice versa) of the inverter (600A) is provided by the functionality of the circuit (340b). Resistors (R1-R6) and PMOS transistors (MP12-MP16) are previously described above (with reference to FIG. 5C). During a state transition phase of the inverter (600A), the combination of a capacitor (C1-C5) series connected to a corresponding transistor (MS12-MS16) provides fast capacitive voltage division (C1 paired with MS12, C2 paired with MS13, etc). This is important because during the output transition, the drain nodes for MS11-MS16 will be pulled low, and the capacitive division prevents the gate nodes (vg12-vg16) from being pulled lower than the desired level. Due to the fast response of capacitors, the capacitive voltage division provided in the circuit (340b) can rapidly adjust voltages at nodes of the high stack (310) for maintaining a desired biasing voltage at those nodes through the state transition phase, whereas the slower resistive voltage divider (R1-R6) can provide the required DC bias voltages during the OFF state. The person skilled in the art will realize that during an ON state of the high stack (310), all transistors of the high stack are ON and therefore voltage at nodes (vd11s12-vd15s16) is substantially equal to Vdd.

Upon a change of state at the input of the HSHV inverter (600A), a corresponding rate of change of the output voltage $V_{SW}$ (output slew rate) to transition to a new state can depend on a capacitive load coupled to the common node carrying the output voltage $V_{SW}$. As capacitor nodes (e.g. N1-N5 of FIG. 6B) carrying capacitive division voltages are coupled (e.g. via transistors MP12-MP16) to nodes of the high/low biasing stacks (330/325) which can see voltage transitions at a rate which is faster than the slew rate of the output voltage $V_{SW}$, charge bled off from such capacitor nodes (e.g. due to a voltage difference between the capacitor nodes and the coupled nodes of the high/low biasing stacks) can depend on the output voltage slew rate.

Figure 7A:
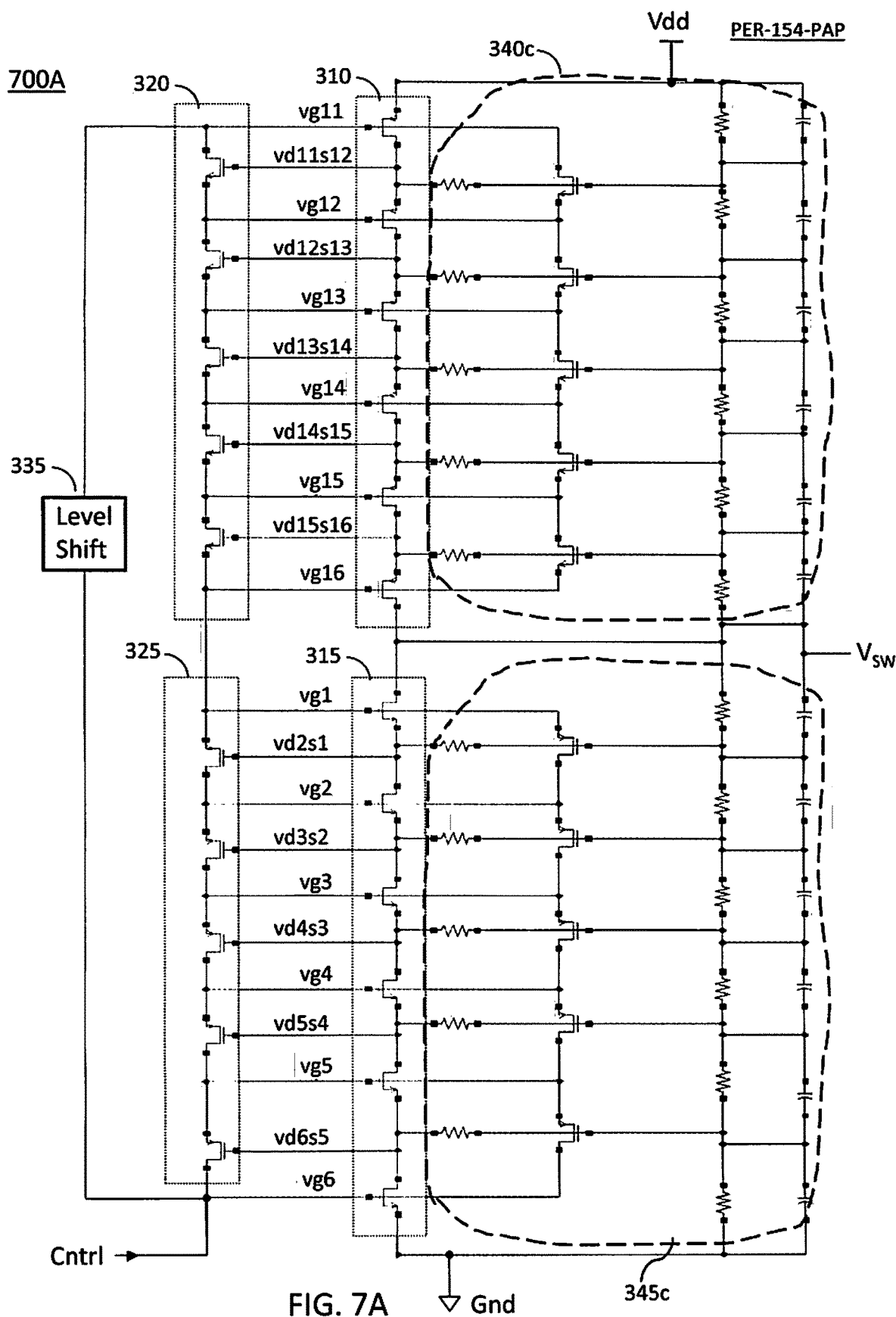
FIG. 7A represents a circuit diagram of an exemplary third embodiment HSHV driver according to the present disclosure.

FIG. 7A represents a circuit diagram of an HSHV inverter (700A) according to a third embodiment of the present disclosure which uses buffering transistors (in circuits 340c, 345c) to reduce dependency of charge leakage from capacitive nodes (e.g. nodes N1-N5 of 340c, 345c, as shown, for example, in FIG. 7B for the case of 340c) with respect to the slew rate of the output voltage $V_{SW}$. The person skilled in the art will recognize that the circuit diagram of FIG. 7A is a build up from the circuit diagram of FIG. 6A, with some modifications to the circuits (340b, 345b) of FIG. 6A to provide, for example, the functionality of the buffering transistors discussed above and as further depicted in FIG. 7B which includes further details of the circuit (340c) of FIG. 7A.

Figure 7B:
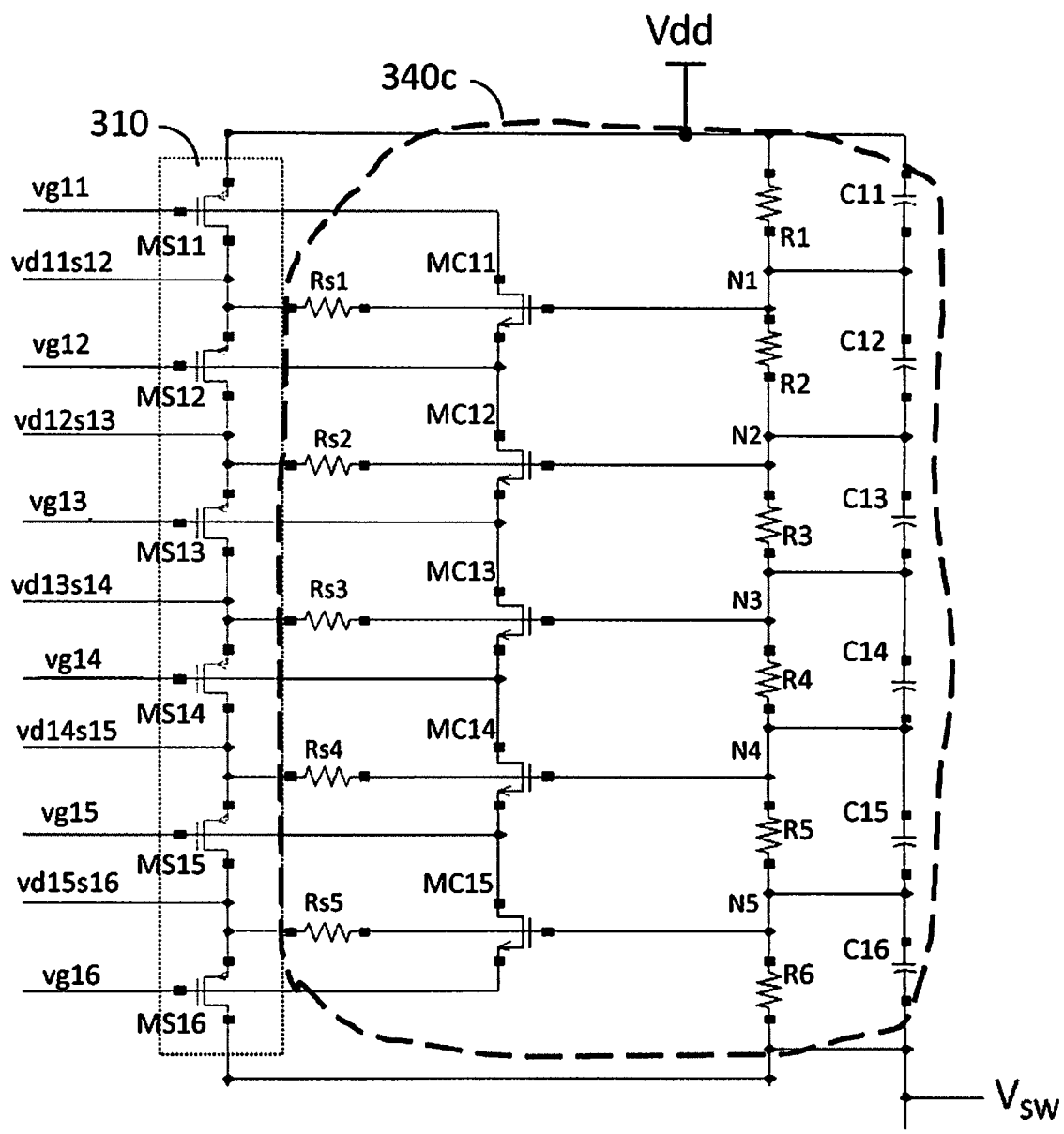
FIG. 7B is an enlarged view of a section of the circuit diagram of FIG. 7A.

As can be seen in the circuit diagrams of FIGS. 7A-7B, a stack of series connected capacitors (C11-C16) in parallel with the stack of series connected resistors (R1-R6) create the capacitive and resistive voltage division at nodes (N1-N5), where the nodes (N1-N5) are buffered, via transistors (MC11-MC15), to common source-drain nodes of the biasing stacks (320, 325). In addition to providing buffering to such nodes, NMOS transistors (MC11-MC15) act as clamps to keep the gates of the transistors (MS11-MS16) of the stack (310) from getting pulled up by a change of the output voltage $V_{SW}$ through voltage coupling associated to Cgs and Cgd capacitances of the transistors. The various capacitors (360) of the HSHV inverter of FIGS. 6A-6B are replaced by the series capacitor stack (C11-C16) in FIGS. 7A-7B to provide same functionality. It should be noted that the circuit (345c) coupled to the low stack (315) of the HSHV inverter (700A) has similar interconnecting components to the circuit (340c) depicted in FIG. 7B, and provides same functionality to the low stack (315), except that it uses PMOS transistors instead of the NMOS transistors (MC11-MC15).

Figure 7C:
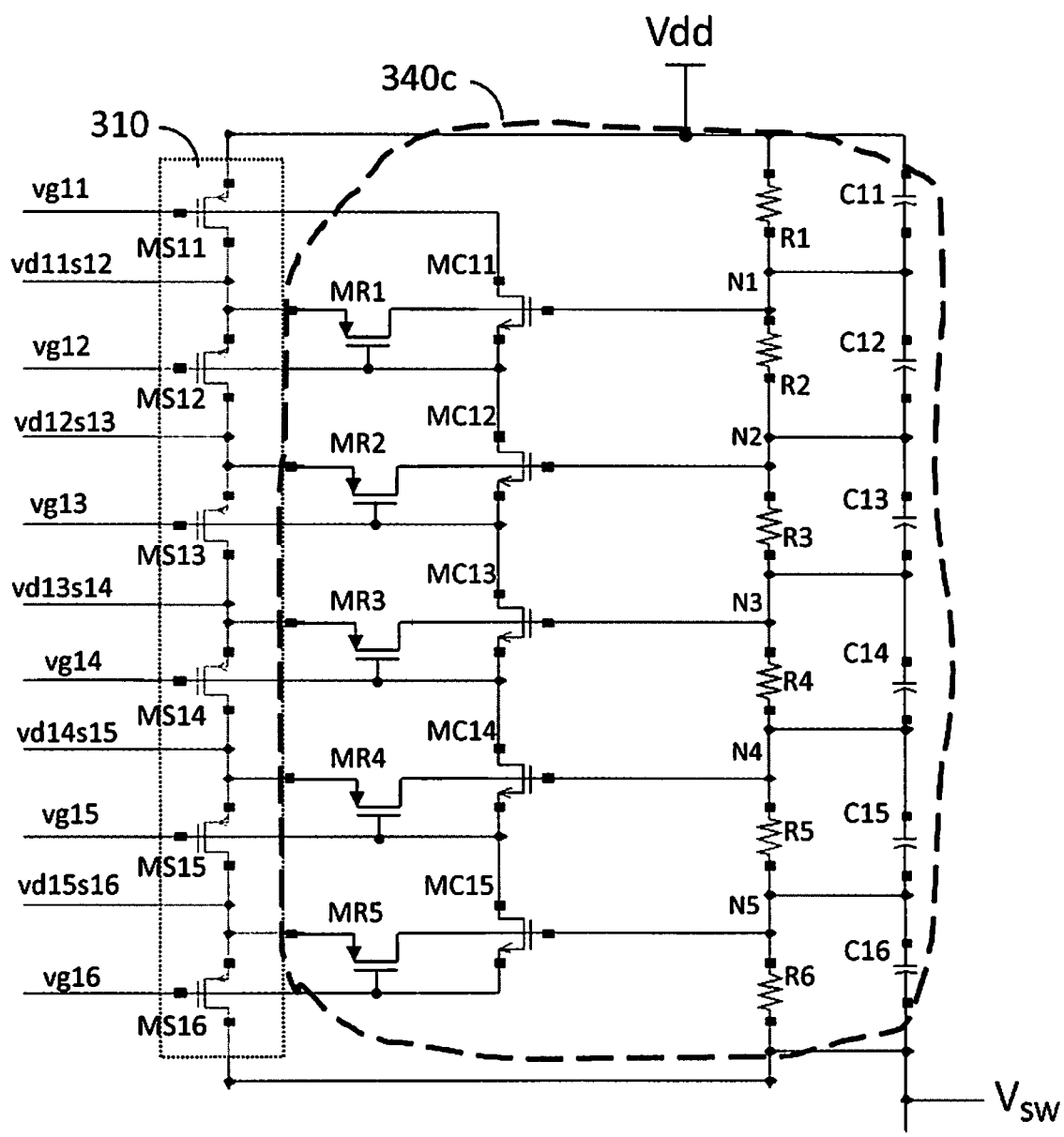
FIG. 7C is an alternative embodiment according to the present disclosure to the circuit of FIG. 7B.

It may be desirable to further limit the leakage off the capacitors (C11-C16) during a transition time associated to a change of state of the output $V_{SW}$ of the inverter (700A). According to one embodiment of the present disclosure, this can be achieved by replacing the resistors (Rs1-Rs5) of circuit (340c) in FIG. 7B with PMOS transistors as shown in FIG. 7C. The person skilled in the art will realize that same functionality can be provided by replacing equivalent resistors in the lower half portion of the inverter circuit (345c) with NMOS transistors instead of PMOS transistors.

Figure 8A:
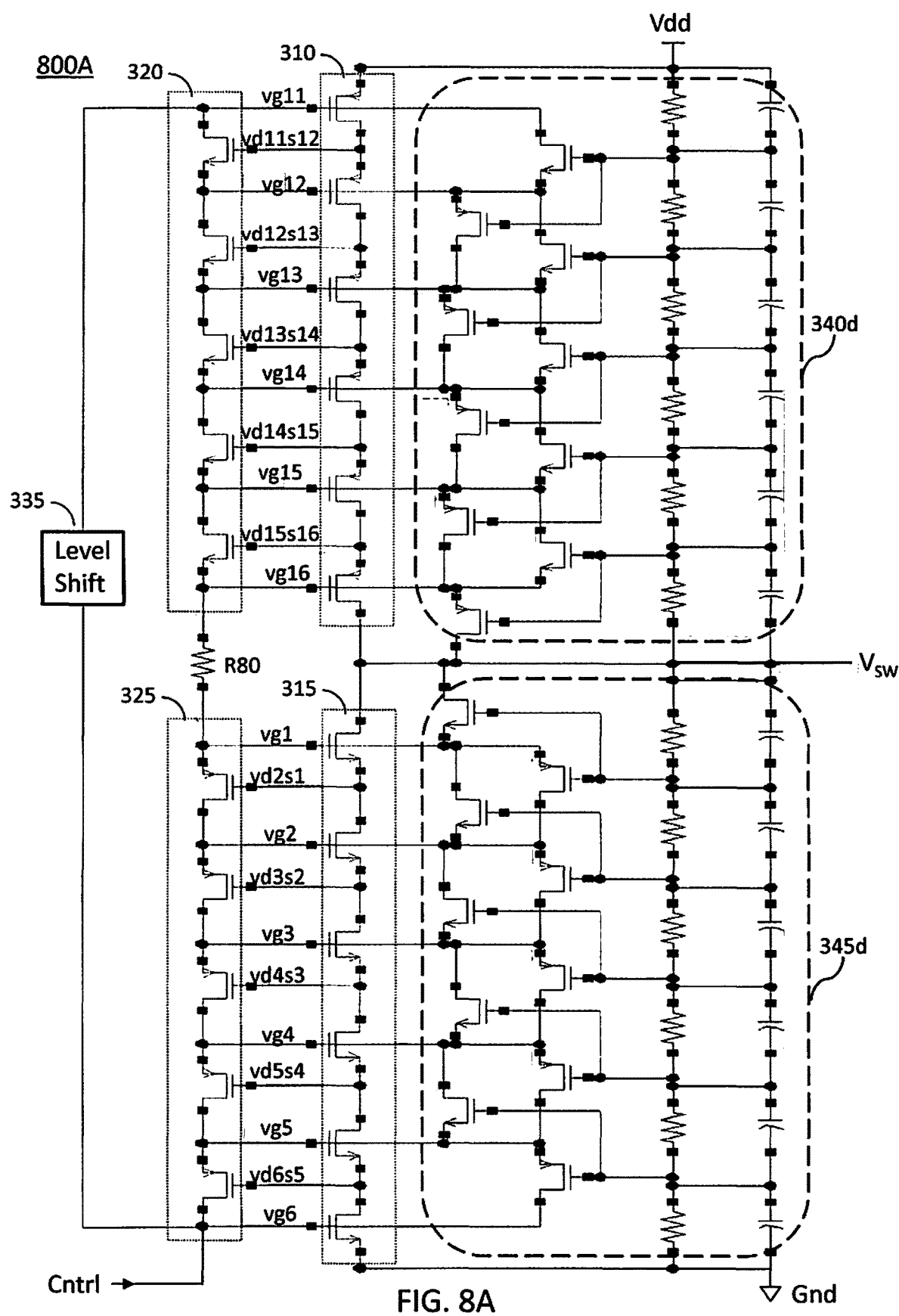
FIG. 8A represents a circuit diagram of an exemplary fourth embodiment HSHV driver according to the present disclosure.
Figure 8B:
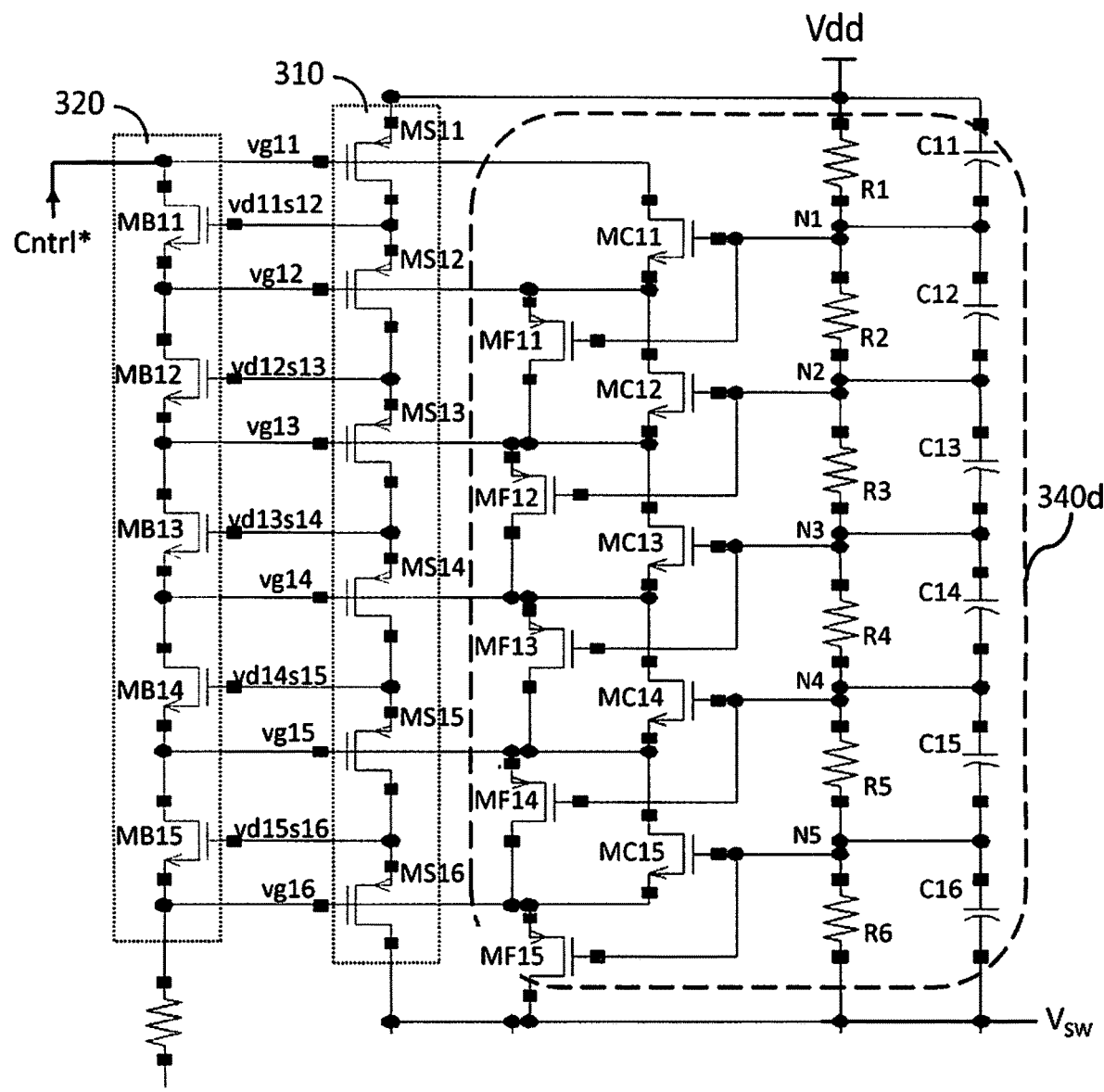
FIG. 8B is an enlarged view of a section of the circuit diagram of FIG. 8A.

FIG. 8A represents a circuit diagram of a fourth exemplary embodiment of an HSHV inverter (800A) according to the present disclosure, where further isolation of the capacitive and resistive divider nodes (e.g. N1-N5) is provided via stacked transistors where each transistor of the stack is configured as a source follower, as seen in FIG. 8A and FIG. 8B. The addition of stacked PMOS transistors (MF11-MF15) in circuit (340d) of the inverter (800A) further isolates nodes (N1-N5) irrespective of a polarity of a voltage change at the output node $V_{SW}$ during a state transition phase of the HSHV inverter (800A). Added stack of NMOS transistors to the lower portion circuit (345d) of the inverter (800A) as seen in FIG. 8A provides for same functionality. As can be seen in FIG. 8A, with further details in FIG. 8B, each of the circuits (340d, 345d) comprise two stacks of transistors (e.g. (MC11-MC15) and (MF11-MF15) of FIG. 8B) of opposite polarity which serve as source followers and isolation to the capacitive and resistive nodes (e.g. (N1-N5)), as well as voltage clamps to limit voltage swings at the nodes (vg1-vg5, vg12-vg16) of the high/low stacks (310/315) caused by capacitive coupling to output $V_{SW}$ voltage swings.

FIG. 8A also contains a resistor (R80), which couples the bias circuitry (320 and 325). This resistor limits the instantaneous current that may be undesirably generated during a change of state of the input by the sets of source follower transistors (MC11-MC15 and MF11-MF15). If too high, this instantaneous current can over time cause electro-migration damage to the device. The current can also disrupt the input by generating a noise component. The added resistor helps to limit the instantaneous currents, thereby improving the reliability of the device and suppressing this potential noise source.

The HSHV inverters according to the various exemplary embodiments presented above can operate from DC to high speed (e.g. 100 MHZ and higher) at voltages substantially higher than a voltage handling capability of its constituent transistors via a modular and stackable design approach. Higher voltage capability is provided by using transistor stacks (310, 315) of higher heights (higher number of stacked transistors), where biasing circuitry (320, 325, 340, 345, 360) can precisely control bias voltages applied to the transistor stacks without sacrificing speed of operation. Capacitive voltage division, via series connected capacitor stacks (C11-C16), is used to provide high speed biasing during state transition phase of the HSHV inverter, and resistive voltage division, via series connected resistor stacks (R1-R6), is used to provide biasing in the steady states (e.g. OFF) of the stacks. Transistor stacks, (320, 325), are used to control ON/OFF operation of the main stacks (310, 315) as dictated by a level of an input signal, whereas transistor stacks (MC11-MC15) and (MF11-MF15) are used to provide capacitive/resistive voltage division to nodes of the stacks (310, 315) while protecting the gates of the transistors of the stacks (310, 315) from overvoltage (higher than a desired operating voltage of the transistors) by clamping the gate voltage of MS12-MS16 during a state transition phase of the inverter.

Figure 9A:
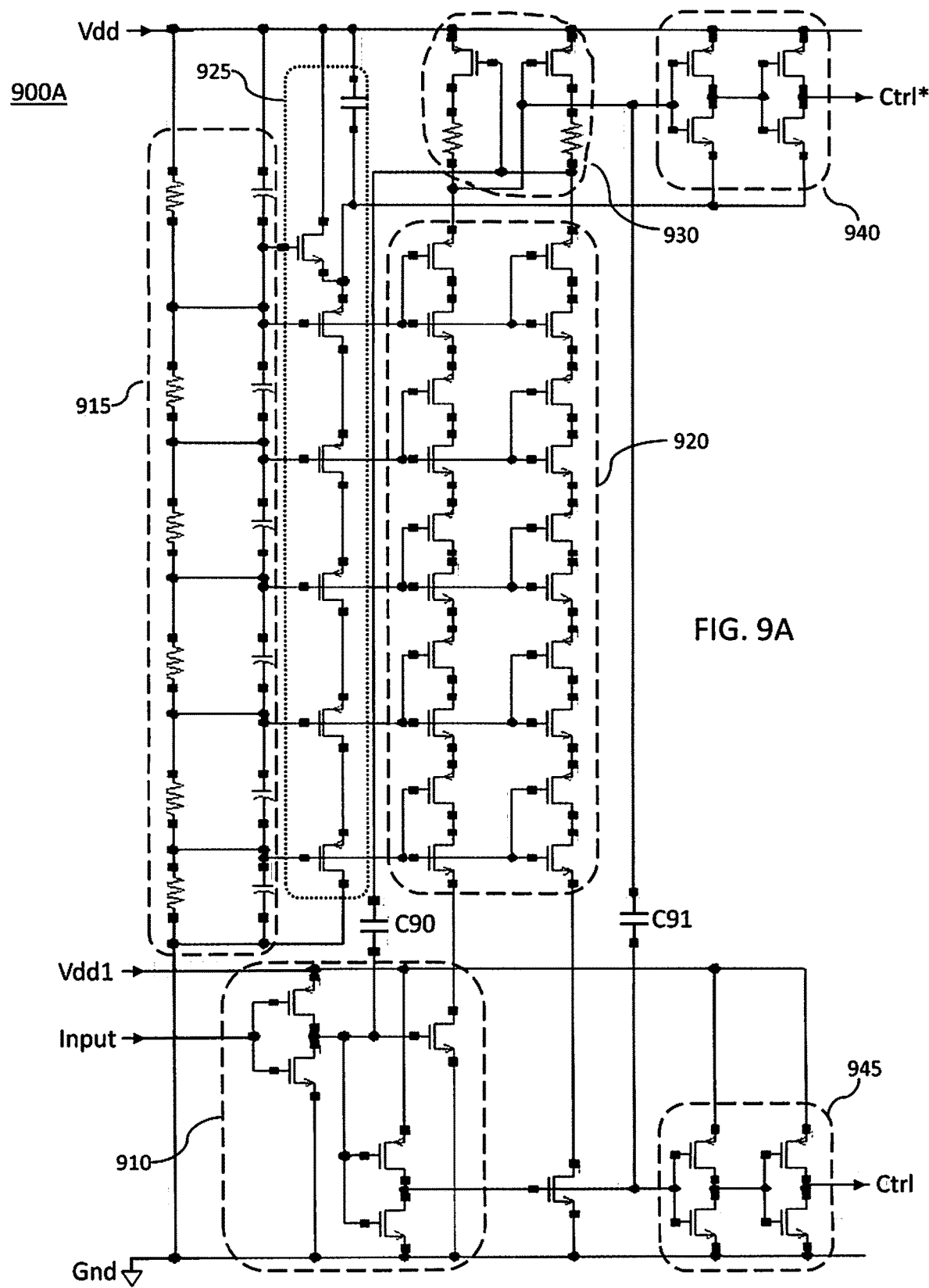
FIG. 9A represents a circuit diagram of a level shifter according to an embodiment of the present disclosure for use in the HSHV drivers according to the present disclosure.
Figure 9B:
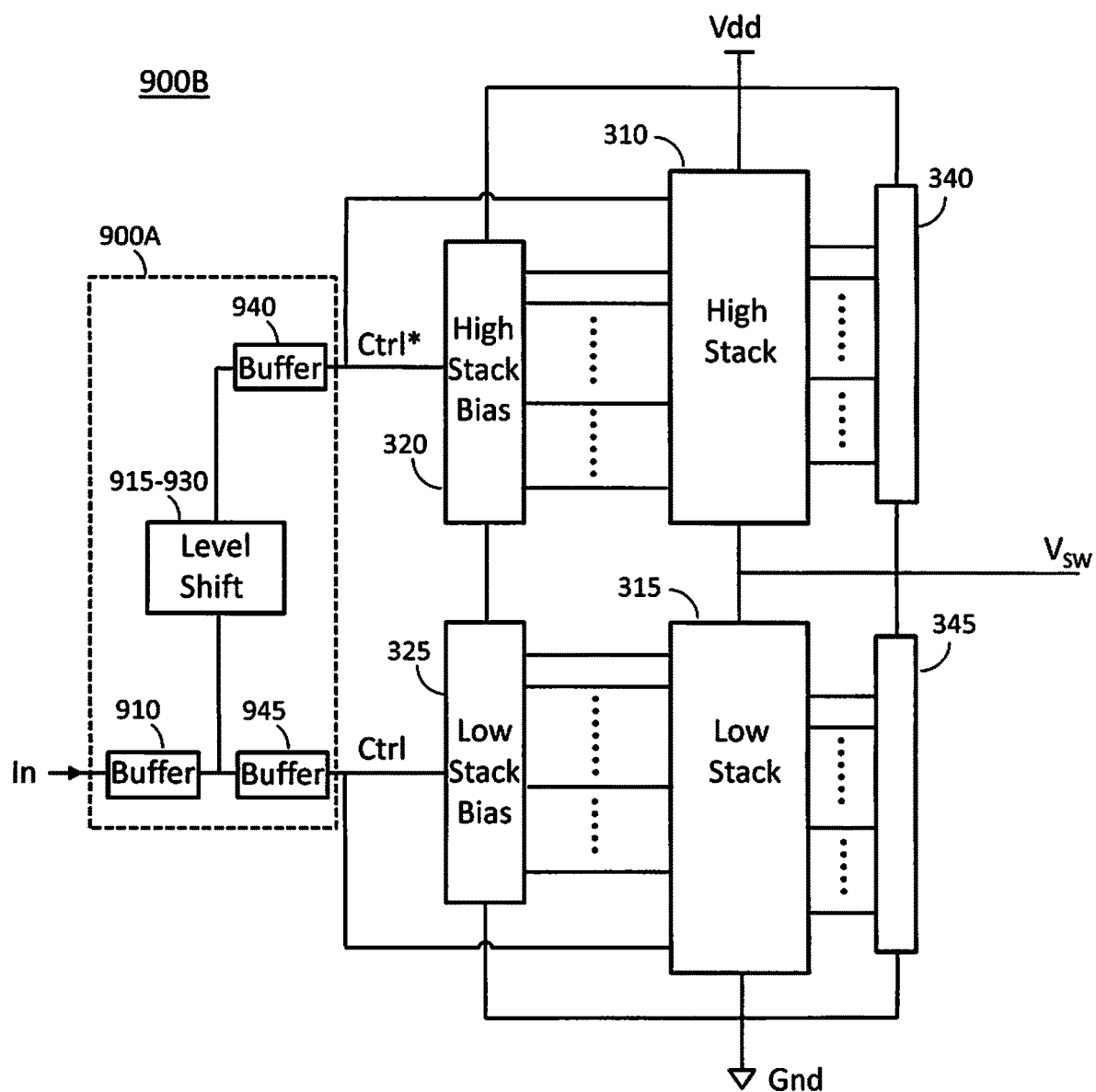
FIG. 9B represents a block diagram of an exemplary HSHV driver according to the present disclosure including the level shifter of FIG. 9A.

FIG. 9A represents a circuit diagram of an exemplary level shifter (900A) which can be used to provide a level shifted version of an input signal to the high stack (310) of the HSHV inverter according to the present invention. As can be seen in the circuit diagram, the level shifter (900A) comprises an input buffering stage (910) which buffers an input signal, Input, to the inverter and feeds the buffered input signal to two buffers; a buffer (945) which outputs the Cntrl input signal to the low stack (315) of the HSHV inverter, and a buffer (940) which outputs the level shifted version of the input signal, Cntrl*, which is in phase with the Cntrl signal, to the high stack (310) of the HSHV inverter. Buffers (910, 945) operate between the reference low voltage (Gnd) and Vdd1 (e.g. 2.5V), whereas the buffer (940) operates between the high voltage Vdd (e.g. 15 V) and a high buffer reference voltage substantially equal to Vdd−Vdd1 (e.g. 12.5 V). Generation of the high buffer reference voltage is provided by circuit (915) comprising stacked series connected resistors in parallel with stacked series connected capacitors, circuit (925) comprising stacked PMOS transistors each configures as a voltage follower to buffer nodes of the circuit (915), circuit (920) comprising two parallel identical stacks of series connected NMOS and PMOS transistors, and circuit (930). It should be noted that all transistors used in the level shifter (900A) have a voltage handling capability which is substantially lower (e.g. 2.5 V) than the high voltage Vdd (e.g. 15 V). FIG. 9B shows a simplified block diagram of an HSHV inverter according to the present disclosure including the level shifter (900A). Capacitors C90 and C91 are added to ensure the voltages applied to the cross coupled devices (910, 930, 940, and 945) are maintained during fast transitions. Specifically, capacitor (C90) ensures the voltage between 910 and 930 is maintained during a fast transition, and C91 ensures the voltage between 940 and 945 is maintained during a fast transition.

This level shifter implementation in FIG. 9A has the advantage of low static current. The only static current is through the resistor divider in circuit (915). This current may be minimized by increasing the resistor values in the resistor divider.

Figure 10:
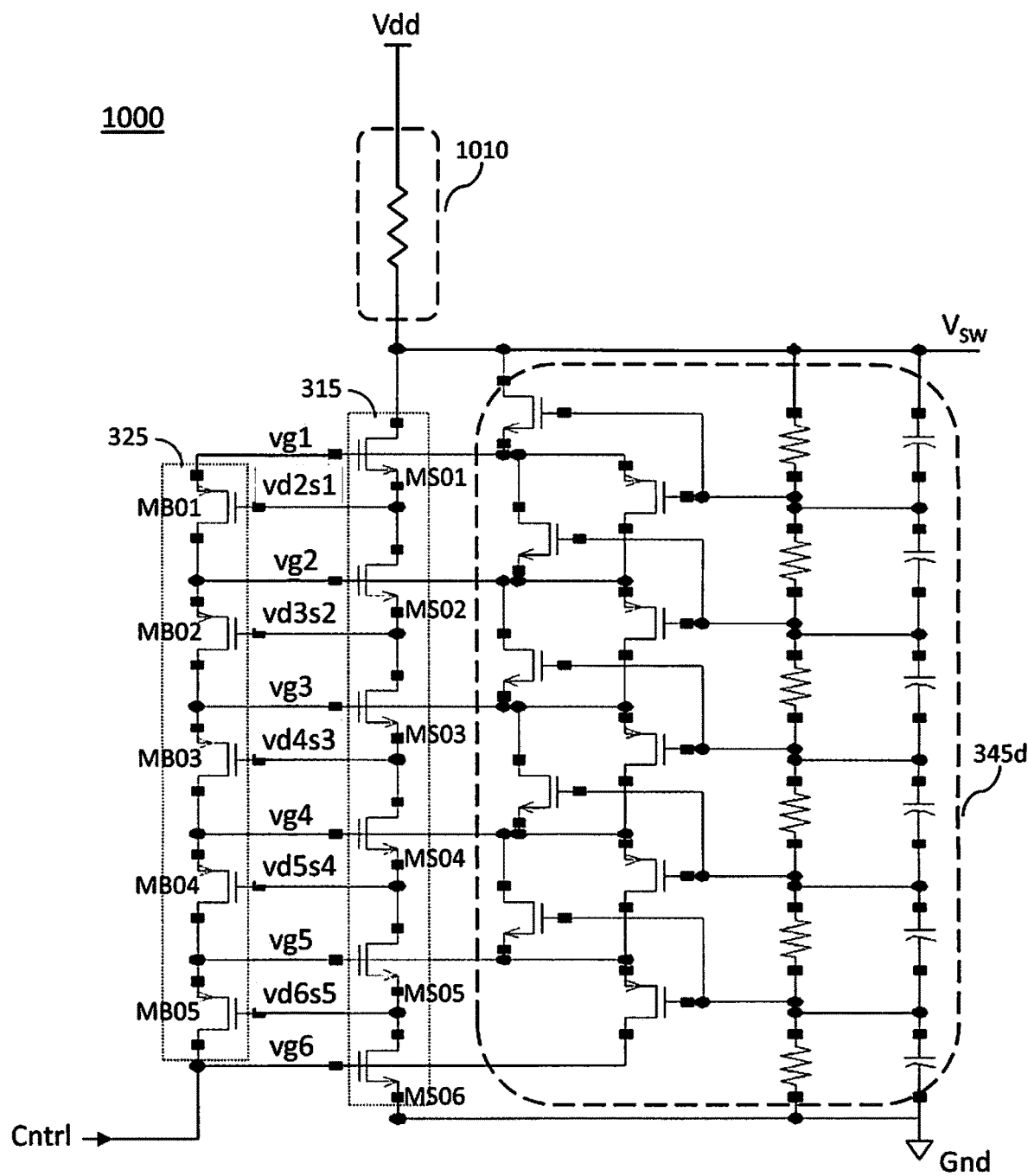
FIG. 10 represents a block diagram of an exemplary HSHV driver in open-drain configuration with a pull-up element according to an embodiment of the present disclosure.

According to an embodiment of the present disclosure, a top half or bottom half portion of the HSHV inverters presented above can be used as a driver with open-drain configuration. An exemplary case of such embodiment is represented in FIG. 10, where a bottom half of the HSHV inverter of FIG. 8A, comprising the low stack (315), the low stack biasing circuit (325) and the circuit (345d) are used with a same interconnection to provide the functionality of an open-drain driver under control of the Cntrl signal. The open-drain, corresponding to a current sinking node $V_{SW}$, can be used to connect a pull-up element (1010) connected between the node $V_{SW}$ and the high voltage supply Vdd. Accordingly, under control of the Cntrl signal, voltage at node $V_{SW}$ can toggle between a high voltage substantially equal to the Vdd voltage (for Cntrl=Low), and a low voltage substantially equal to the reference voltage Gnd (for Cntrl=High). Although in the exemplary case depicted in FIG. 10 a resistor is shown as the pull-up element (1010), the person skilled in the art readily understands that other elements, such as, for example, a diode, can be used instead and/or in combination with the resistor.

Figure 11:
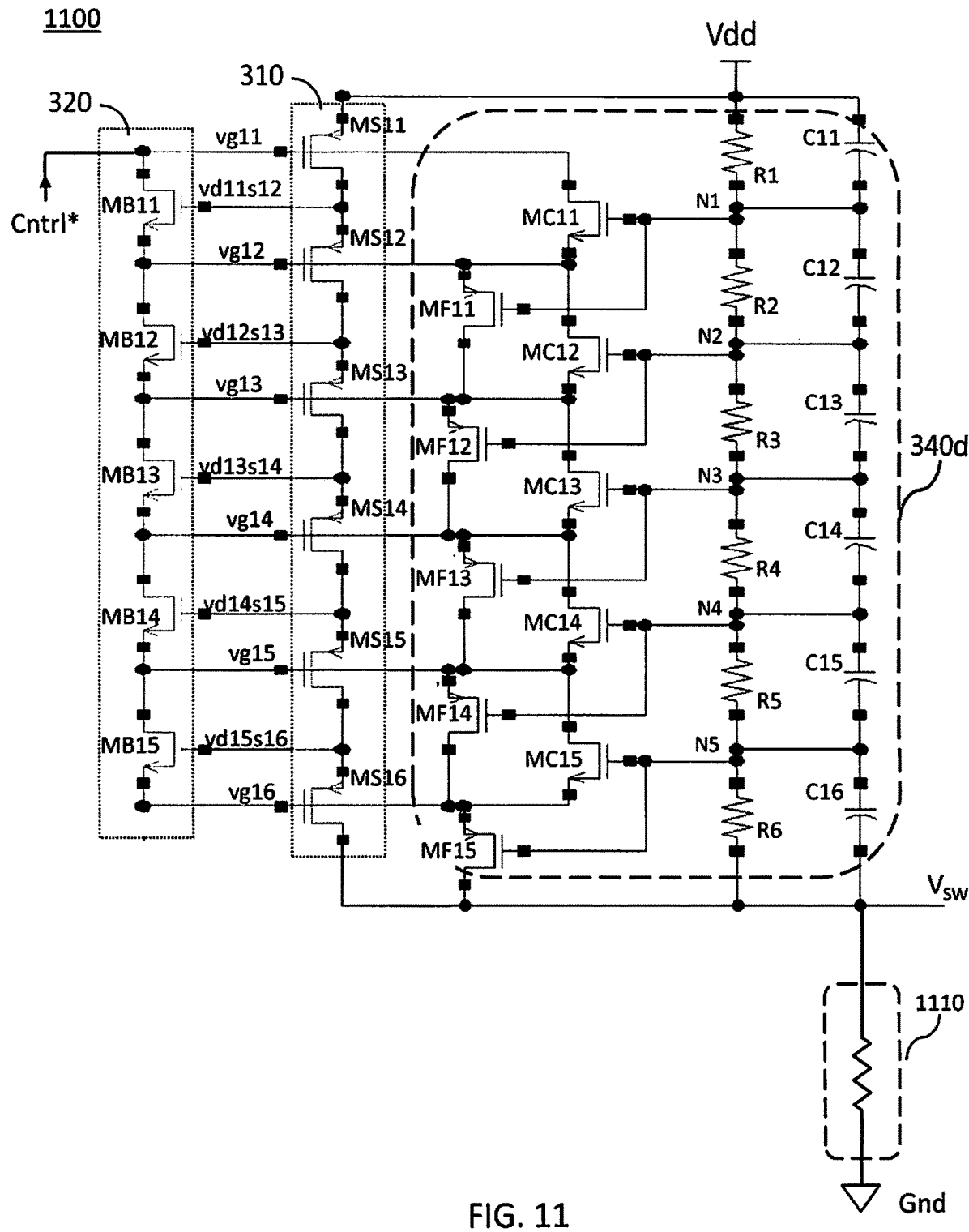
FIG. 11 represents a block diagram of an exemplary HSHV driver in open-drain configuration with a pull-down element according to an embodiment of the present disclosure.

According to a further embodiment of the present disclosure, an open-drain configuration with pull-down element can be provided by considering the top half of the HSHV inverter of FIG. 8A, or any of the HSHV inverters presented above. FIG. 11 represents such an open-drain embodiment (1100) with pull-down element (1100), based on the HSHV inverter of FIG. 8A. In such exemplary configuration, a level shifted control signal, Cntrl*, fed to the gate of transistor MS11 of the high stack (310) dictates the high/low state of the output signal at node $V_{SW}$. Accordingly, under control of the Cntrl* signal, voltage at node $V_{SW}$ can toggle between a high voltage substantially equal to the Vdd voltage (for Cntrl*=Low), and a low voltage substantially equal to the reference voltage Gnd (for Cntrl*=High).

When compared to the two-stack configuration of the various embodiments according to the present disclosure discussed above (e.g. FIGS. 3A-9B) where two series connected stacks (low/high stack 315/310) are used to generate an output at a common node of the two stacks, the single stack configuration depicted in FIG. 10 allows for a simpler configuration while providing some of the same benefits as provided by the two-stack configuration. In particular, the stack biasing circuit (325) and the circuit (345d) allow operation of the single stack open-drain configuration over higher voltages than a voltage handling capability of any individual transistor of the stack (315) and do not require a level shifter (e.g. 335 of FIGS. 3A-3C, 6A, 7A, 8A). The single stack open-drain configuration of the present disclosure can be used, for example, in DC-DC applications where only a pull-up or pull-down is used in a conjunction with a diode element.

With the present description, an innovative high speed and high voltage HSHV driver that operates over voltages substantially higher than the voltage handling capability of the low voltage transistors used in the HSHV driver has been disclosed.

Applications that may include the novel apparatus and systems of various embodiments include electronic circuitry used in high speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A high speed high voltage (HSHV) driver comprising:
   a first stack of transistors of a first type coupled between an output node of the HSHV driver and one of a) a high voltage or b) a reference voltage;
   a second stack of transistors of a second type coupled to nodes of the first stack of transistors in a one to one relationship;
   a first network of series-connected resistors comprising a plurality of resistive nodes coupled to common source-drain nodes of the first stack of transistors in a one to one relationship; and
   a first network of series-connected capacitors comprising a plurality of capacitive nodes coupled to the plurality of resistive nodes in a one to one relationship;
   wherein:
   the high voltage is substantially higher than desired operating voltages of transistors of the first stack and of the second stack.

2. The HSHV driver of claim 1, wherein:
   gate nodes of the second stack of transistors are coupled to the common source-drain nodes of the first stack of transistors in a one to one relationship.

3. The HSHV driver of claim 2, wherein:
   gate nodes of the first stack of transistors are coupled to source and/or gate nodes of the second stack of transistors in a one to one relationship.

4. The HSHV driver of claim 3, wherein:
   the output node is a drain node of an output transistor of the first stack,
   the gate nodes of the first stack of transistors except the output transistor are coupled to the drain nodes of the second stack, and
   the gate node of the output transistor is coupled to a source node of a respective transistor of the second stack of transistor.

5. The HSHV driver of claim 1, wherein:
   biasing voltages of the first stack of transistors are controllable by the second stack of transistors, the first network of series connected resistors, and the first network of series connected capacitors such as to not exceed the desired operating voltages of the transistors of the first stack of transistors.

6. The HSHV driver of claim 1, wherein:
   a number of transistors of the first stack of transistors is one more than a number of transistors of the second stack of transistors.

7. The HSHV driver of claim 6, wherein the number of transistors of the first stack is equal to or higher than three.

8. The HSHV driver of claim 1, wherein the first type is P-type and the second type is N-type.

9. The HSHV driver of claim 8, wherein:
   the output node of the HSHV driver is a drain node of an output transistor of the first stack of transistors, and
   the output node of the HSHV driver is coupled to the reference voltage through a resistor.

10. The HSHV driver of claim 9, wherein:
    an input node of the HSHV driver is a gate node of an input transistor of the first stack of transistors, and
    a source node of the input transistor is connected to the high voltage.

11. The HSHV driver of claim 1, wherein the first type is N-type and the second type is P-type.

12. The HSHV driver of claim 11, wherein:
    the output node of the HSHV driver is a drain node of an output transistor of the first stack of transistors, and the output node of the HSHV driver is coupled to the high voltage through a resistor.

13. The HSHV driver of claim 12, wherein:
an input node of the HSHV driver is a gate node of an input transistor of the first stack of transistors, and
a source node of the input transistor is connected to the reference voltage.

14. The HSHV driver of claim 1, wherein the HSHV driver operates in:
an ON mode, wherein a voltage at the output node of the HSHV driver is substantially equal to the high voltage and all transistors of the first stack and of the second stack are ON, and
an OFF mode, wherein the voltage at the output node of the HSHV driver is substantially equal to the reference voltage and all transistors of the first stack and of the second stack are OFF,
wherein operation in one of the ON mode and the OFF mode is based on a voltage level of an input signal to the HSHV driver.

15. The HSHV driver of claim 1, wherein the plurality of resistive nodes are coupled to the common source-drain nodes of the first stack according to one or more of a) a direct coupling, b) a resistive coupling, or c) a transistor coupling.

16. The HSHV driver of claim 1, wherein:
the plurality of resistive nodes are coupled through respective transistors to gate nodes of the first stack in a one to one relationship.

17. The HSHV driver of claim 16, wherein a coupling through the respective transistors comprises a source-follower circuit.

18. The HSHV driver of claim 1, further comprising:
a third stack of transistors of the second type coupled between the output node of the HSHV driver and the other one of a) a high voltage or b) a reference voltage;
a fourth stack of transistors of the first type coupled to nodes of the third stack of transistors in a one to one relationship;
a second network of series-connected resistors comprising a plurality of resistive nodes coupled to common source-drain nodes of the third stack of transistors in a one to one relationship; and
a second network of series-connected capacitors comprising a plurality of capacitive nodes coupled to the plurality of resistive nodes of the second network of series-connected resistors in a one to one relationship.

19. A method for biasing a stack of transistors of a first type for operation at a high voltage substantially higher than desired operating voltages of the transistors, the method comprising:
coupling nodes of a biasing stack of transistors of a second type to nodes of the stack of transistors in a one to one relationship;
coupling resistive nodes of a resistor network to common source-drain nodes of the stack of transistors in a one to one relationship;
coupling capacitive nodes of a capacitor network to the resistive nodes in a one to one relationship;
during a transition phase of the stack of transistors, controlling biasing voltages to the stack of transistors by way of the coupled capacitor network; and
after the transition phase, controlling the biasing voltages by way of the coupled resistor network,
wherein:
the biasing voltages are controllable such as to not exceed desired operating voltages of the transistors of the stack of transistors during and after a transition phase responsive to a change of state of an input signal to a first transistor of the stack of transistors.

20. The method according to claim 19, further comprising:
during the transition phase of the stack of transistors, controlling biasing voltages to the stack of transistors by way of the coupled capacitor network; and
after the transition phase, controlling the biasing voltages by way of the coupled resistor network,
wherein:
during the transition phase, transistors of the stack of transistors and the biasing stack of transistors sequentially change state, from an ON state to an OFF state, or vice versa.

* * * * *